United States Patent
Harada et al.

(10) Patent No.: US 7,180,341 B2
(45) Date of Patent: Feb. 20, 2007

(54) VARIABLE DIVISION METHOD AND VARIABLE DIVIDER

(75) Inventors: Mitsuru Harada, Kanagawa (JP); Akihiro Yamagishi, Kanagawa (JP)

(73) Assignee: Nippon Telegraph and Telephone Public Corporation, Tokyo (JP)

( * ) Notice: Subject to any disclaimer, the term of this patent is extended or adjusted under 35 U.S.C. 154(b) by 50 days.

(21) Appl. No.: 10/545,718

(22) PCT Filed: May 17, 2004

(86) PCT No.: PCT/JP2004/006628

§ 371 (c)(1),
(2), (4) Date: Aug. 12, 2005

(87) PCT Pub. No.: WO2004/105247

PCT Pub. Date: Dec. 2, 2004

(65) Prior Publication Data

US 2006/0145736 A1   Jul. 6, 2006

(30) Foreign Application Priority Data

May 20, 2003   (JP)   ............................ 2003-142518

(51) Int. Cl.
*H03B 19/00*   (2006.01)
(52) U.S. Cl. ...................................... 327/117; 327/115
(58) Field of Classification Search ...................... None
See application file for complete search history.

(56) References Cited

U.S. PATENT DOCUMENTS 4,837,721 A   6/1989   Carmichael et al.

(Continued)

FOREIGN PATENT DOCUMENTS

JP   11-055108   2/1998

(Continued)

OTHER PUBLICATIONS

"Frequency divider generates 50% duty cycle" by Andrzej Partyka; *EDN—Electrical Design News*; Sep. 3, 1987; No. 18; Newton, MA; pp. 244/246.

(Continued)

*Primary Examiner*—Timothy P. Callahan
*Assistant Examiner*—Cassandra Cox
(74) *Attorney, Agent, or Firm*—Blakely Sokoloff Taylor & Zafman

(57) ABSTRACT

A feedback path (307) is formed between an output (310c) of a fixed divider (305) and a control terminal (310b) of an inverting/noninverting unit (304). A connection device (306) is arranged on the feedback path (307). The feedback path (307) is connected/disconnected according to the level of the control signal M from outside, thereby switching the number of divisions. The delay time of the signal given to the input terminal (310a) of the inverting/noninverting unit (304) to pass through the feedback path (307) and return to the control terminal (310b) is set greater than the pulse width of the input clock signal. A small pulse input invalidating function is provided in the fixed divider (305). Alternatively, a small pulse output prohibiting function is provided in the inverting/noninverting unit (304). The fixed divider (305) divides the clock signal before division from the inverting/noninverting unit (304) according to the leading edge of the clock pulse of the normal pulse width in the signal (a change point corresponding to the leading edge of the input clock signal).

8 Claims, 15 Drawing Sheets

U.S. PATENT DOCUMENTS 5,422,584 A * 6/1995 Waters ...................... 327/113
5,969,548 A   10/1999 Knapp

FOREIGN PATENT DOCUMENTS

JP          11-150472        6/1999
JP          11-186900        7/1999

OTHER PUBLICATIONS

"Handbook of Logic Circuits", J.D. Lenk, pp. 123-125, Reston Publishing Company, Inc. 1972.

"CMOS Analog Circuit Design Technique", edited by Akira Iwata, KK. Triceps, Nov. 13, 1998.

* cited by examiner

| 410a | 410b | OUTPUT |
|------|------|--------|
| 1 | 1 | 0 |
| 1 | 0 | 1 |
| 0 | 1 | 1 |
| 0 | 0 | 0 |

| 210a | 210b | OUTPUT |
|------|------|--------|
| 1 | 1 | 0 |
| 1 | 0 | 1 |
| 0 | 1 | 1 |
| 0 | 0 | 0 |

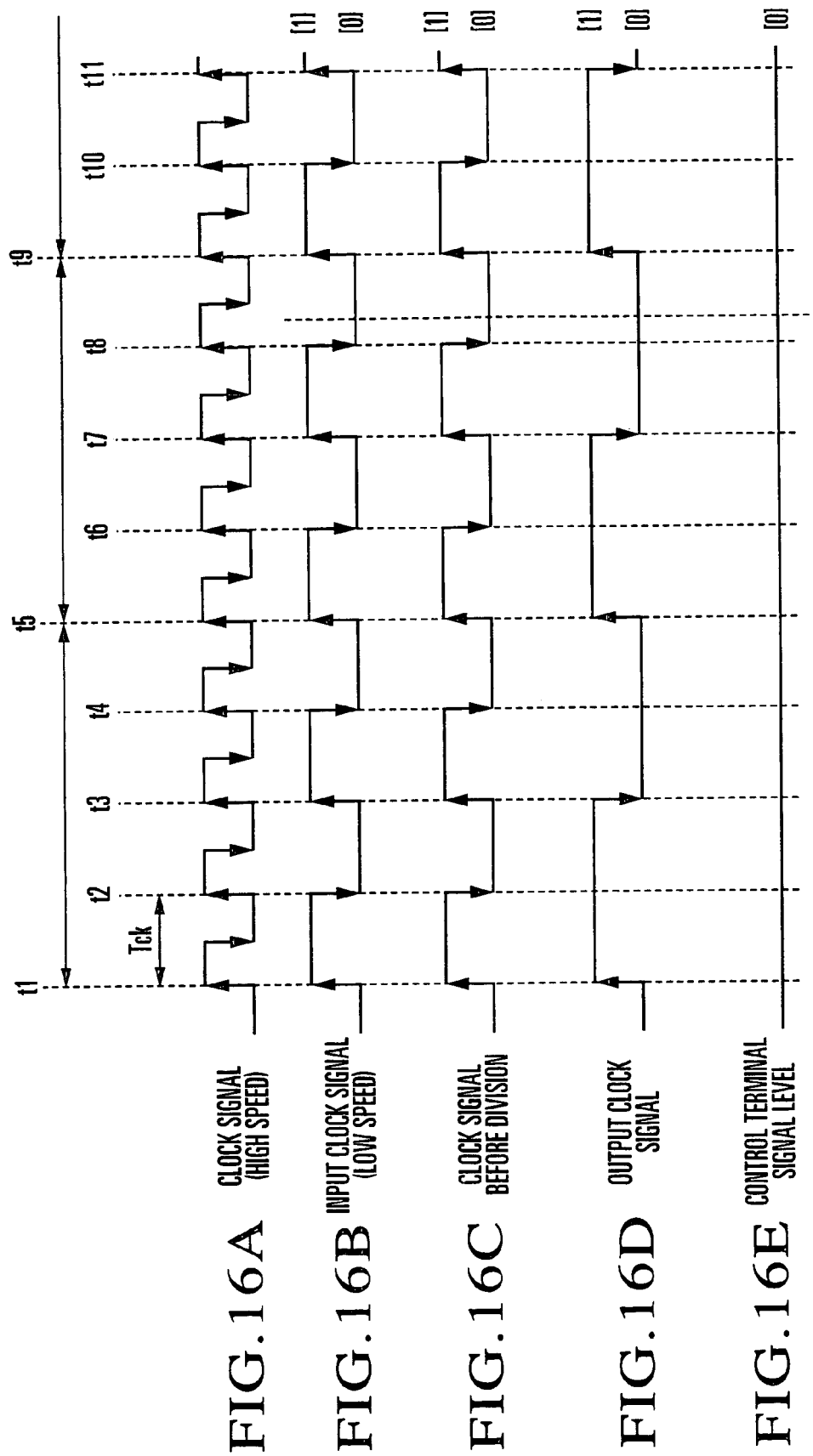

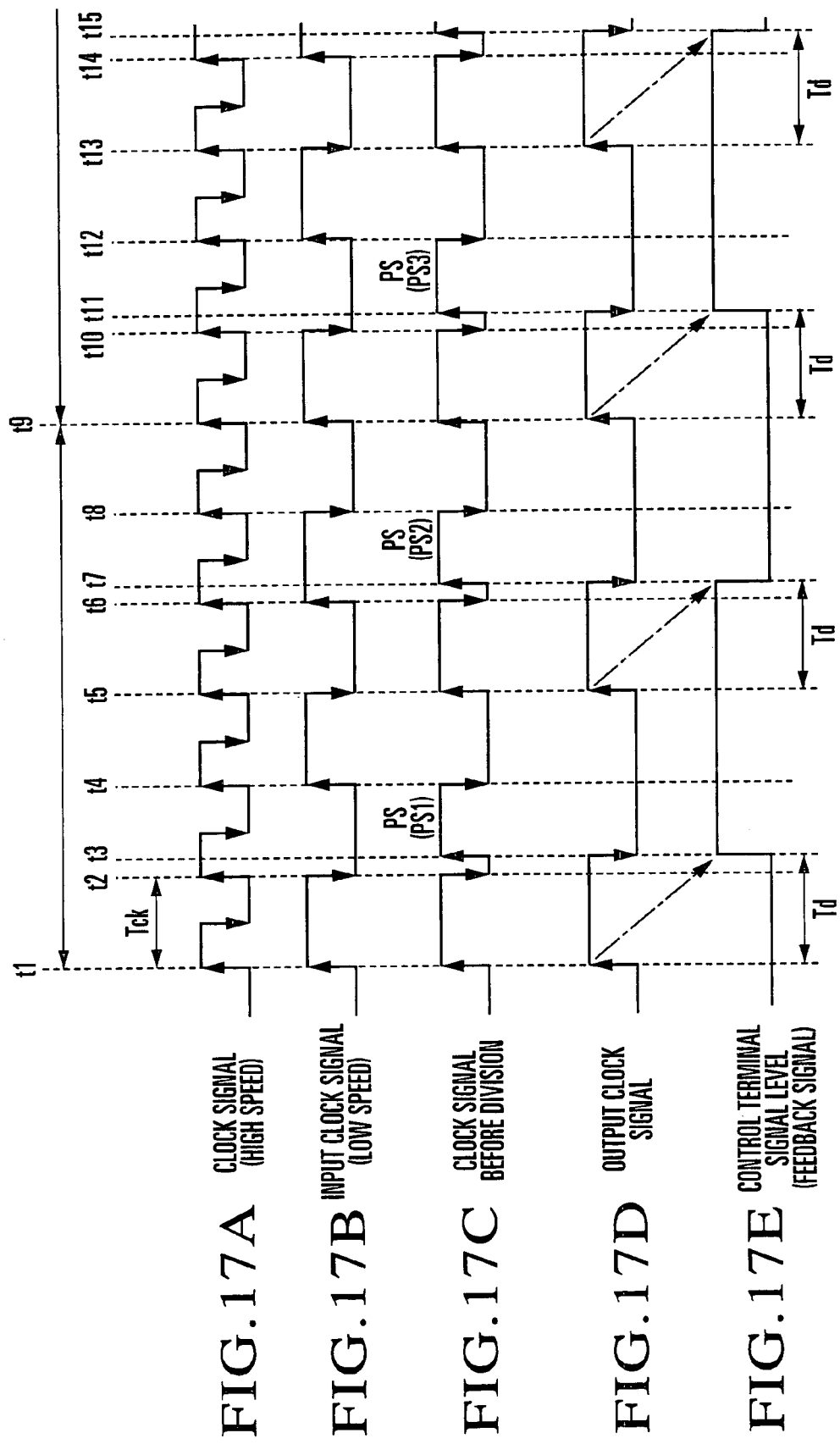

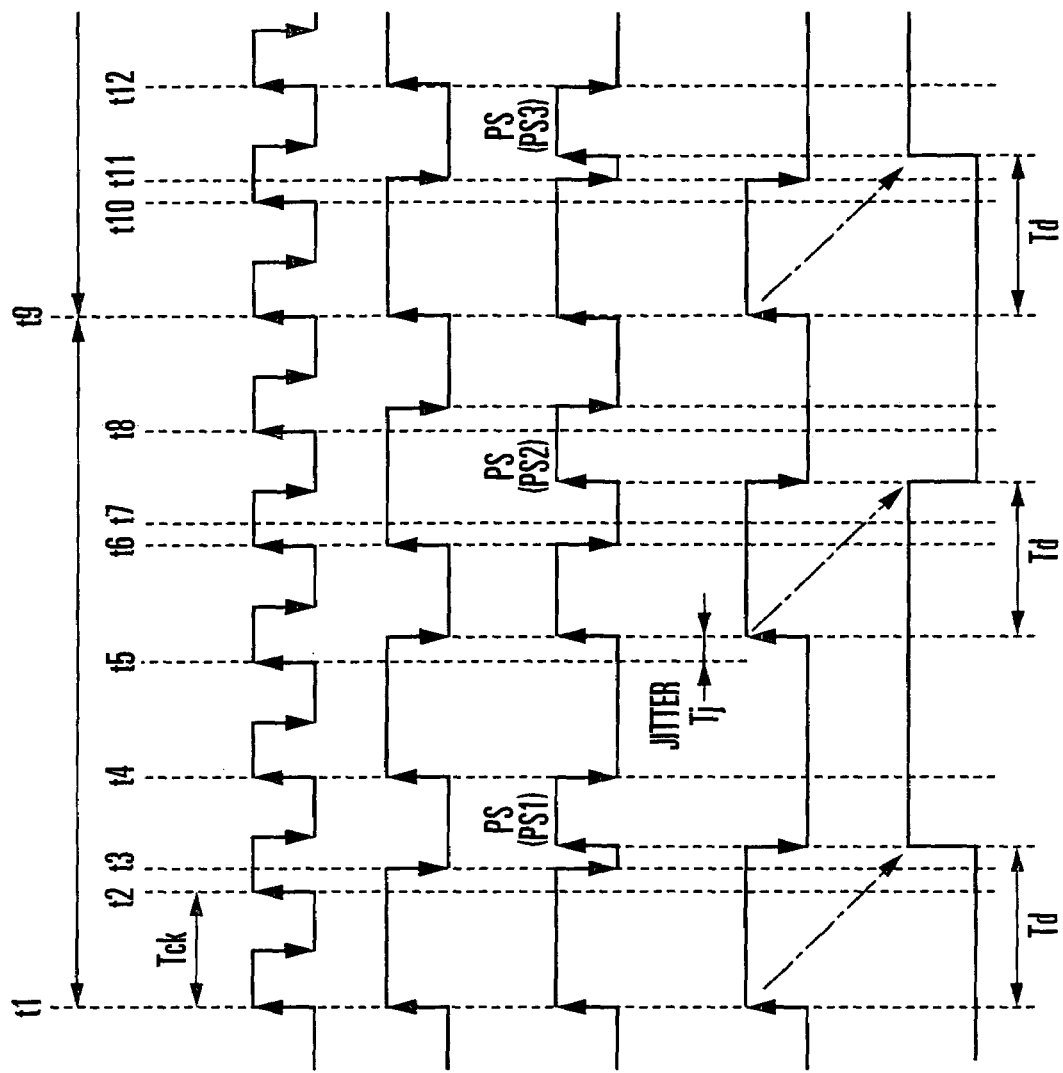

VARIABLE DIVISION METHOD AND VARIABLE DIVIDER

The present patent application is a non-provisional application of International Application No. PCT/JP2004/006628, filed May 17, 2004.

TECHNICAL FIELD

The present invention relates to a variable division method and variable divider which divide an input clock signal by a frequency division number determined in accordance with an external control signal, and outputs the frequency-divided clock signal as an output clock signal.

BACKGROUND ART

As a variable divider of this type, a variable divider having two types of frequency division numbers for an input clock signal and capable of switching the frequency division numbers in accordance with an external control signal is conventionally used.

[Prior Art 1]

FIG. 13 shows an outline of a conventional variable divider disclosed in non-patent reference 1. A variable divider 100 includes a clock input terminal 101, clock output terminal 102, and control signal input terminal 103, divides an input clock signal from the clock input terminal 101 by a frequency division number determined in accordance with a control signal M input from the control signal input terminal 103, and outputs the frequency-divided clock signal as an output clock signal from the clock output terminal 102.

In this prior art, the variable divider 100 is made up of blocks 100A and 100B. The block 100A includes D-flip-flops (DFFS) 104 to 106 and NOR circuits (NORS) 107 and 108, and the block 100B includes T-flip-flops (TFFs) 109 to 111 and OR circuits (ORs) 112 to 114. Note that the functions of the TFFs and DFFs are described in non-patent reference 2, so an explanation thereof will be omitted.

In the block 100A, an input clock signal from the clock input terminal 101 is applied to the clock terminals (ck) of the DFFs 104 to 106. A ¼ or ⅕ divided signal is obtained at a point P1 by the operations of the DFFs 104 to 106 having received this input clock signal, and the ¼ or ⅕ divided signal is further divided by the TFFs 109 to 111 in the block 100B.

The OR 112 ORs the outputs from the TFFs 109 and 110, the OR 113 ORs the output from the TFF 111 and the control signal M from the control signal terminal 103, the OR 114 ORs the outputs from the ORs 112 and 113, and the output from the OR 114 is applied to the NOR 108 of the block 100A. When the control signal M is level "0", therefore, the block 100A performs division by 5 only once during division by 32 and performs division by 4 in the rest of the operation, thereby realizing division by 33. When the control signal M is level "1", the block A performs division by 4 during the whole of division by 32, thereby realizing division by 32.

[Prior Art 2]

FIG. 14 shows an outline of a conventional variable divider disclosed in patent reference 1. A variable divider 200 includes a clock input terminal 201, clock output terminal 202, and control signal input terminal 203, divides a clock signal input from the clock input terminal 201 by a frequency division number determined in accordance with a control signal (external control signal) M input from the control signal input terminal 203, and outputs the frequency-divided clock signal as an output clock signal from the clock output terminal 202. In this prior art, the variable divider 200 includes a divider (½ divider) 204 for low-speed clock, inverting/noninverting unit 205, fixed divider (½ divider) 206, connection device 207, and feedback divider (½ divider) 208, and the inverting/noninverting unit 205 and fixed divider 206 form a signal processor 210. The inverting/noninverting unit 205 has an input terminal 210a and control terminal 210b, the input terminal (the input terminal of the signal processor 210) 210a is connected to the clock input terminal 201 via the divider 204 for low-speed clock, and a feedback path 209 is formed between the control terminal (the control terminal of the signal processor 210) 210b and an output (the output terminal of the signal processor 210) 210c of the fixed divider 206. The connection device 207 and feedback divider 208 are arranged on the feedback path 209. FIG. 15 shows a truth table of the inverting/noninverting unit 205.

[When Feedback Path Is Disconnected]

When the control signal M is level "0", the connection device 207 turns off the feedback path 209 to disconnect the output 210c of the fixed divider 206 from the control terminal 210b of the inverting/noninverting unit 205. In this case, the level of the control terminal 210b of the inverting/noninverting unit 205 changes to "0", and, in accordance with the truth table shown in FIG. 15, the inverting/noninverting unit 205 passes the input clock signal without inverting it, and applies the signal as a clock signal before division to the fixed divider 206.

FIG. 16 shows a timing chart when the feedback path 209 is disconnected. FIG. 16(a) denotes a clock signal (master clock) applied to the clock input terminal 201; FIG. 16(b), an input clock signal applied to the input terminal 210a of the inverting/noninverting unit 205; FIG. 16(c), a clock signal before division (a clock signal before division applied to the fixed divider 206) output from the inverting/noninverting unit 205; FIG. 16(d), an output clock signal from the fixed divider 206; and FIG. 16(e), the signal level of the control terminal 210b of the inverting/noninverting unit 205.

In this prior art, the clock signal from the clock input terminal 201 is divided by 2 by the divider 204 for low-speed clock, and the low-speed clock signal is applied as an input clock signal to the input terminal 210a of the inverting/noninverting unit 205. As is apparent from this timing chart, when the control signal M is level "0", the variable divider 200 generates an output clock signal having one pulse whenever two clock pulses of the input clock signal are applied to the input terminal 210a of the inverting/noninverting unit 205, i.e., whenever four master clocks are applied to the clock input terminal 201, thereby operating as a ¼ divider.

[When Feedback Path Is Connected]

When the control signal M is level "1", the connection device 207 turns on the feedback path 209 to connect the output 210c of the fixed divider 206 to the control terminal 210b of the inverting/noninverting unit 205. FIG. 17 shows a timing chart when the feedback path 209 is connected. Note that in this timing chart, a delay time Td during which a signal applied to the input terminal 210a of the inverting/noninverting unit 205 is returned to the control terminal 210b of the inverting/noninverting unit 205 through the inverting/noninverting unit 205, fixed divider 206, and feedback path 209 is made slightly larger than a pulse width Tck of the input clock signal.

When the input clock signal rises at a point t1 shown in FIG. 17(b), the inverting/noninverting unit 205 passes the leading edge of this input clock signal without inverting it. Consequently, a clock signal before division rises (the point t1 shown in FIG. 17(c)), and is applied to the fixed divider 206. The fixed divider 206 receives the leading edge (change point) of this clock signal before division, and raises an output clock signal (the point t1 shown in FIG. 17(d)).

The leading edge of this output clock signal is returned to the control terminal 210b of the inverting/noninverting unit 205 via the feedback path 209. That is, the leading edge of the output signal from the fixed divider 206 is applied to the feedback divider 208, and the feedback divider 208 receives the leading edge of the output signal from the fixed divider 206, and raises a feedback signal to be applied to the control signal 210b of the inverting/noninverting unit 205. To the control terminal 210b of the inverting/noninverting unit 205, the leading edge of the feedback signal is input (a point t3 shown in FIG. 17(e)) as it lags behind the leading edge (the leading edge of the first clock pulse: the point t1 in FIG. 17(b)) of the input clock signal applied to the input terminal 210a of the inverting/noninverting unit 205, by the delay time Td, i.e., by a delay time larger than the pulse width Tck of the input clock signal.

While the feedback signal to the control terminal 210b is high, the inverting/noninverting unit 205 inverts the input clock signal from the input terminal 210a. In this case, when the feedback signal to the control terminal 210b of the inverting/noninverting unit 205 rises (the point t3 shown in FIG. 17(e)), the input clock signal to the input terminal 210a of the inverting/noninverting unit 205 has already fallen. Therefore, the inverting/noninverting unit 205 inverts the input clock signal from the input terminal 210a, and raises a clock signal before division (the point t3 shown in FIG. 17(c)). After that, the clock signal before division is a signal obtained by inverting the input clock signal from the input terminal 210a.

Consequently, between the point t3 and a point t4 shown in FIG. 17(c), a clock pulse (small pulse) PS1 having a pulse width smaller than the pulse width Tck (normal pulse width) of the input clock signal is generated. After that, a clock pulse having the normal pulse width is generated between points t5 and t6. The fixed divider 206 receives the leading edge of the small pulse PS1 of the clock signal before division from the inverting/noninverting unit 205, and lowers an output clock signal (the point t3 shown in FIG. 17(d)). When the clock pulse having the normal pulse width is generated (the point t5 shown in FIG. 17(c)) after the small pulse PS1 is generated, the fixed divider 206 receives the leading edge of this clock pulse, and raises an output clock signal (the point t5 shown in FIG. 17(d)).

The leading edge of this output clock signal is applied to the feedback divider 208, and the feedback signal to the control terminal 210b of the inverting/noninverting unit 205 falls. To the control terminal 210b of the inverting/noninverting unit 205, the trailing edge of the feedback signal is input (a point t7 shown in FIG. 17(e)) as it lags behind the trailing edge (the trailing edge of the second clock pulse: the point t5 shown in FIG. 17(b)) of the input clock signal applied to the input signal 210a of the inverting/noninverting unit 205, by the delay time Td, i.e., by a delay time larger than the pulse width Tck of the input clock signal.

While the feedback signal to the control terminal 210b is low, the inverting/noninverting unit 205 passes the input clock signal from the input terminal 210a without inverting it. In this case, when the feedback signal to the control terminal 210b of the inverting/noninverting unit 205 falls (the point t7 shown in FIG. 17(e)), the input clock signal to the input terminal 210a of the inverting/noninverting unit 205 has already risen. Therefore, the inverting/noninverting unit 205 passes the input clock signal from the input terminal 210a without inverting it, and raises a clock signal before division (the point t7 shown in FIG. 17(c)). After that, the clock signal before division is a signal obtained by passing the input clock signal from the input terminal 210a without inverting it.

Consequently, a small pulse PS2 is generated between the point t7 and a point t8 shown in FIG. 17(c), and a clock pulse having the normal pulse width is generated between points t9 and t10 after that. The fixed divider 206 receives the leading edge of the small pulse PS2 from the inverting/noninverting unit 205, and lowers an output clock signal (the point t7 shown in FIG. 17(d)). After that, the fixed divider 206 receives the leading edge of the clock pulse having the normal pulse width from the inverting/noninverting unit 205, and raises an output clock signal (the point t9 shown in FIG. 17(d)).

By repeating the same operation after that, the variable divider 200 generates an output clock signal having two pulses, if the control signal M is at level "1", whenever three clock pulses of the input clock signal are applied to the input terminal 210a of the inverting/noninverting unit 205, i.e., whenever six master clocks are applied to the clock input terminal 201, thereby operating as a ⅓ divider.

Patent reference 1: U.S. Pat. No. 5,969,548

Non-patent reference: "CMOS Analog Circuit Design Techniques", supervised by Boku Iwata, Triceps, Jan. 13, 1998, pp. 236 and 237, FIGS. 16 and 17.

Non-patent reference 2: "HANDBOOK OF LOGIC CIRCUITS", J. D. LENK, pp. 123–125, Reston Publishing Company, Inc., 1972.

Disclosure of Invention

Problems to be Solved by the Invention

[Problem of Prior Art 1]

The variable divider 100 of prior art 1 has a large number of branch points, so paths C, for example, indicated by the dotted lines in FIG. 13, form critical paths (paths having a large capacitive load and requiring a large driving current), and this makes low power consumption difficult to achieve.

[Problem of Prior Art 2]

The variable divider 200 of prior art 2 has a small number of branch points and does not generate any path having a large capacitive load such as a critical path, so low power consumption can be realized. However, frequency division is performed using both the rise and trailing edges of an input clock signal which is the output of the divider 204 for low-speed clock. If the duty ratio of the input clock signal is not 50%, therefore, jitter Tj (FIG. 18) occurs in the output clock signal, and this deteriorates the noise performance.

[Reason for Jitter Occurrence]

The variable divider 200 of prior art 2 forms a low-speed input clock signal by dividing a high-frequency clock signal (master clock) by 2 by the divider 204 for low-speed clock. In this case, an input clock signal is raised by receiving the first leading edge of the master clock, and lowered by receiving the second leading edge.

In the divider 204 for low-speed clock, it is difficult to make the operation time before the input clock signal is raised by receiving the leading edge of the master clock equal to the operation time before the input clock signal is lowered. By this difference between the operation times of rise/fall, the duty ratio of the input clock signal becomes higher or lower than 50% as an ideal value. It is generally very difficult to accurately set the duty ratio of a high-frequency signal at 50/50, and even a ratio of about 40/60 is evaluated as relatively good.

FIG. 18 shows a case in which the duty ratio (ON duty) of an input clock signal is 50% or more. In this case, the first clock pulse of an output clock signal is generated in synchronism with the leading edge (a point t1 in FIG. 18($a$)), but the second clock pulse is not generated in synchronism with the leading edge (a point t5 in FIG. 18($a$)) of the clock signal, so the jitter Tj occurs. The jitter Tj similarly occurs when the duty ratio (ON duty) of the input clock signal is 50% or less.

The present invention has been made to solve the above problems, and has as its object to provide a variable division method and variable divider which can realize low power consumption, and can also prevent deterioration of the noise performance by substantially eliminating jitter occurring in an output clock signal.

Means for Solving the Problems

To achieve the above object, the present invention has a signal processor which forms a clock signal before division by inverting/without inverting an input clock signal applied to an input terminal in accordance with a level of a signal applied to a control terminal, divides the clock signal before division by a predetermined frequency division number on the basis of a change point, which corresponds to a change point in one direction of the input clock signal, in a clock pulse having a pulse width larger than a predetermined pulse width in the clock signal before division, and outputs the frequency-divided signal as an output clock signal from an output terminal, and a connection device which connects/disconnects, in accordance with an external control signal, a feedback path which is formed between the output terminal and control terminal of the signal processor and functions as a path of a signal to be returned to the control terminal, wherein a delay time during which a signal applied to the input terminal of the signal processor is returned to the control terminal through the feedback path is made larger than a pulse width of the input clock signal.

In the present invention, the feedback path formed between the output terminal and control terminal of the signal processor is connected or disconnected in accordance with an external control signal. Note that in the following description, the initial inverted/noninverted state in the signal processor is set to the noninverting state, and the frequency division number is 2, for the sake of convenience of explanation.

[When Feedback Path Is Disconnected]

When the feedback path is disconnected, the signal processor forms a clock signal before division directly from an input clock signal without inverting it, and obtains an output clock signal by dividing this clock signal before division by 2. In this way, the variable divider of the present invention operates as a ½ divider.

[When Feedback Path Is Connected]

When the feedback path is connected, the signal processor initially forms a clock signal before division directly from an input clock signal without inverting it. The signal processor receives the first leading edge (a change point corresponding to the leading edge of the input clock signal) of this clock signal before division, and raises an output clock signal. The leading edge of this output clock signal is returned to the control terminal via the feedback path.

To the control terminal of the signal processor, the leading edge of the output clock signal is returned as it lags behind the leading edge (the leading edge of the first clock pulse) of the input clock signal applied to the input terminal of the signal processor, by the pulse width of the input clock signal. While the signal (feedback signal) returned to the control terminal is high, the signal processor inverts the input clock signal. Consequently, a clock pulse (small pulse) smaller than the pulse width (normal pulse width) of the input clock pulse is generated in the clock signal before division, and a clock pulse having the normal pulse width is generated after that.

If it is determined that a clock pulse larger than a predetermined pulse width is larger than the pulse width of the small pulse, the signal processor invalidates the small pulse of the clock signal before division, validates the clock pulse having the normal pulse width which is generated after that, receives the leading edge of this clock pulse having the normal pulse width, and lowers an output clock signal. The trailing edge of this output signal is returned to the control terminal of the signal processor via the feedback path.

To the control terminal of the signal processor, the trailing edge of the output clock signal is returned as it lags behind the trailing edge (the trailing edge of the second clock pulse) of the input clock signal applied to the input terminal of the signal processor, by a delay time larger than the pulse width of the input clock signal. While the signal (feedback signal) returned to the control terminal is low, the signal processor forms a clock signal before division directly from the input clock signal without inverting it. Consequently, a clock pulse (small pulse) smaller than the pulse width (normal pulse width) of the input clock signal is generated in the clock signal before division, and a clock pulse having the normal pulse width is generated after that.

In the same manner as above, the signal processor invalidates the small pulse of the clock signal before division, validates the clock pulse having the normal pulse width which is generated after that, receives the leading edge (a change point corresponding to the leading edge of the input clock signal) of this clock pulse having the normal pulse width, and raises an output clock signal. In this manner, the variable divider of the present invention operates as a ⅓ divider. During this dividing operation, the signal processor forms an output clock signal by receiving the leading edge of the clock pulse having the normal pulse width, i.e., a change point corresponding to the leading edge of the input clock signal (a change point corresponding to a change point in one direction of the input clock signal). Therefore, no jitter occurs even if the duty ratio of the input clock signal is higher or lower than 50% as an ideal value.

Note that in the present invention, the signal processor can be formed by an inverting/noninverting unit and fixed divider. In this case, the fixed divider can be given a function "which extracts, from the clock signal before division from the inverting/noninverting unit, only a clock pulse larger than a predetermined pulse width as a valid clock signal", or the inverting/noninverting unit can be given a function "which outputs only a clock pulse larger than a predetermined pulse width as a clock signal before division".

Also, in the present invention, the delay time (the time during which the signal applied to the input terminal of the signal processor is returned to the control terminal through the feedback path) is made larger than the pulse width of the input clock pulse.

However, this delay time may be naturally produced as the total of delay times produced in the route through which the signal applied to the input terminal is returned to the output terminal through the feedback path, or may also be ensured by intentionally forming a delay circuit or the like in this route.

EFFECTS OF THE INVENTION

In the present invention, a clock signal before division is formed by inverting/without inverting an input clock signal applied to an input terminal in accordance with the level of a signal applied to a control terminal, this clock signal before division is divided by a predetermined frequency division number on the basis of a change point, which corresponds to a change point in one direction of the input clock signal, in a clock pulse having a pulse width larger than a predetermined pulse width in the clock signal before division, and the frequency-divided signal is output as an output clock signal. This makes it possible to realize low power consumption, substantially eliminate jitter occurring in the output clock signal, and prevent deterioration of the noise performance.

BRIEF DESCRIPTION OF DRAWINGS

FIG. 16 is a timing chart showing an operation hen a feedback path is disconnected in prior art 2;

FIG. 17 is a timing chart showing an operation when the feedback path is connected in prior art 2; and FIG. 18 is a timing chart for explaining a situation in which jitter occurs in an output clock signal when the duty ratio of an input clock signal is not 50% in prior art 2.

BEST MODE FOR CARRYING OUT THE INVENTION

The present invention will be described in detail below with reference to the accompanying drawings.

Embodiment 1

Figure 1:
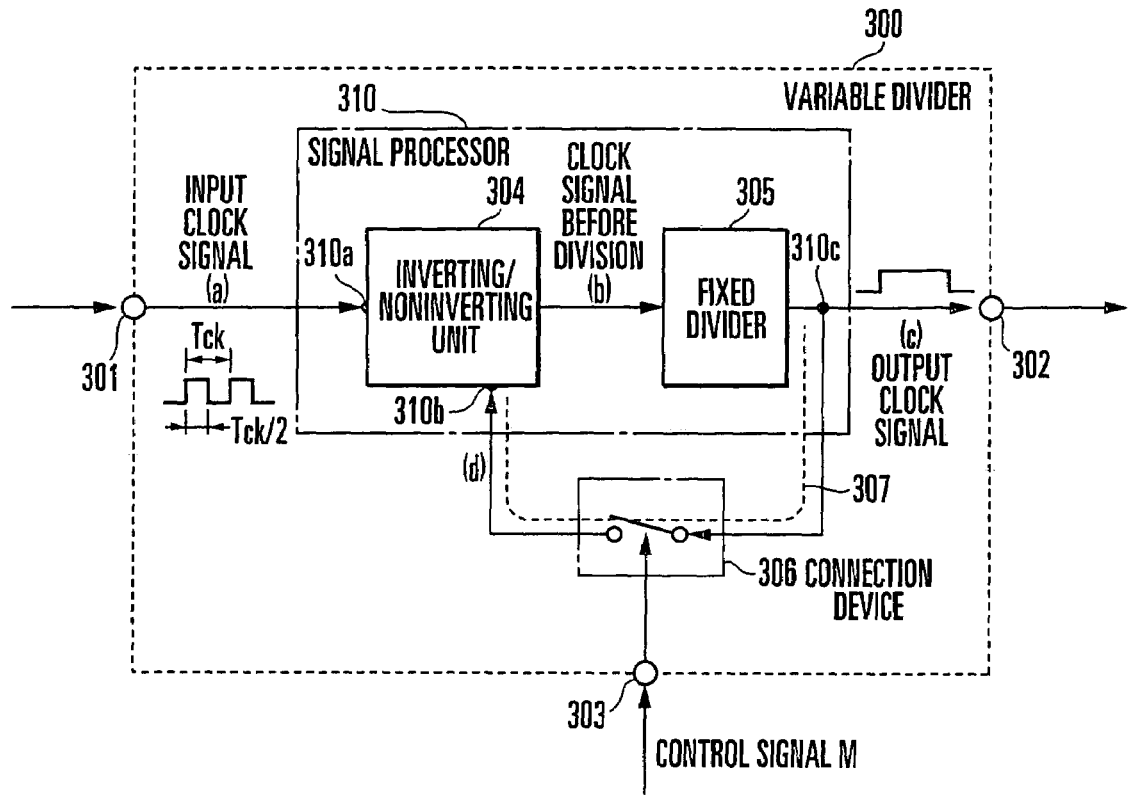
FIG. 1 is a schematic view of a variable divider showing the first embodiment (embodiment 1) of the present invention.

FIG. 1 is a schematic view of a variable divider showing the first embodiment (embodiment 1) of the present invention. The variable divider 300 includes a clock input terminal 301, clock output terminal 302, and control signal input terminal 303, divides an input clock signal from the clock input terminal 301 by a frequency division number determined in accordance with a control signal (external control signal) M input from the control signal input terminal 303, and outputs this frequency-divided clock signal as an output clock signal from the clock output terminal 302.

In embodiment 1, the variable divider 300 includes an inverting/noninverting unit 304, fixed divider 305, and connection device 306, and the inverting/noninverting unit 304 and fixed divider 305 form a signal processor 310. The inverting/noninverting unit 304 has an input terminal 310*a* and control terminal 310*b*, and outputs an input clock signal applied to the input terminal (the input terminal of the signal processor 310) 310*a* as a clock signal before division by inverting/without inverting the input clock signal in accordance with the level of a signal applied to the control terminal (the control terminal of the signal processor 310) 310*b*. In this embodiment, no inversion is performed if the signal applied to the control terminal 310*b* is level "0", and inversion is performed if it is level "1".

The fixed divider 305 receives the clock signal before division from the inverting/noninverting unit 304, extracts, as a valid clock signal, only a clock pulse larger than a predetermined pulse width (the pulse width of a small pulse to be described later) from the clock signal before division, divides this valid clock signal by a predetermined frequency division number, and supplies the signal as an output clock signal to the clock output terminal 302. In this embodiment, the duty ratio of the input clock signal is 50%, and the frequency division number of the fixed divider 305 is 2.

The connection device 306 is inserted into a feedback path 307 formed between an output (the output terminal of the signal processor 310) 310*c* of the fixed divider 305 and the control terminal 310*b* of the inverting/noninverting unit 304. In this embodiment, the feedback path 307 is turned off if the control signal M from the control signal input terminal 303 is level "0", and turned on if the control signal M is level "1". While the feedback path 307 is OFF, the level of the control terminal 310*b* of the inverting/noninverting unit 304 is level "0".

Also, in this embodiment, a time (delay time) Td during which a signal applied to the input terminal 310*a* of the inverting/noninverting unit 304 is returned to the control terminal 310*b* of the inverting/noninverting unit 304 via the inverting/noninverting unit 304, fixed divider 305, and feedback path 307 is made larger than the pulse width (Tck/2) of an input clock signal (Td>Tck/2).

Figure 2:
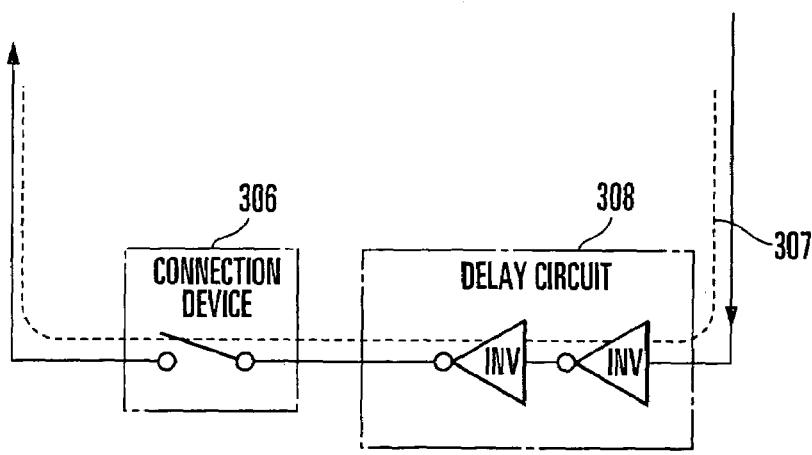
FIG. 2 is a view showing an example in which a delay circuit having two series-connected inverters is formed in a feedback path.

In this embodiment, the delay time Td is presumably naturally produced as the total of delay times in the inverting/noninverting unit 304, fixed divider 305, and feedback path 307. Note that if the total of the delay times in the inverting/noninverting unit 304, fixed divider 305, and feedback path 307 is smaller than Tck/2, the delay time Td is assured by intentionally forming a delay circuit in the route of the inverting/noninverting unit 304, fixed divider 305, and feedback path 307. For example, as shown in FIG. 2, a delay circuit 308 having two series-connected inverters INV is inserted into the feedback path 307.

[When Feedback Path Is Disconnected]

When the control signal M is level "0", the connection device 306 turns off the feedback path 307 to disconnect the output 310c of the fixed divider 305 from the control terminal 310b of the inverting/noninverting unit 304. In this case, the level of the control terminal 310b of the inverting/noninverting unit 304 changes to level "0", so the inverting/noninverting unit 304 passes the input clock signal without inverting it, and applies the signal as a clock signal before division to the fixed divider 305.

Figure 3:
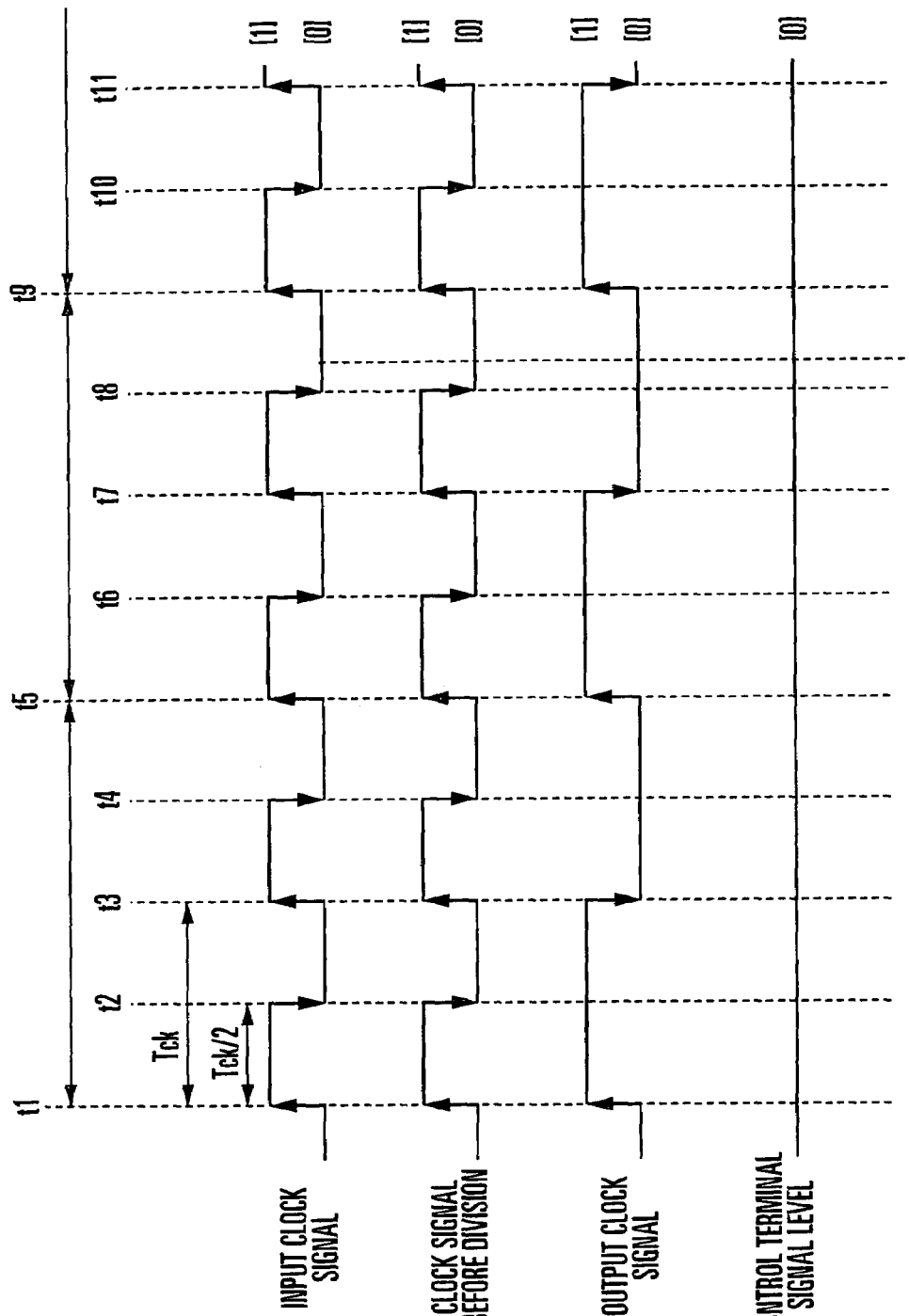
FIG. 3 is a timing chart showing an operation hen the feedback path is disconnected in embodiment 1.

FIG. 3 shows a timing chart when the feedback path 307 is disconnected. FIG. 3(a) indicates an input clock signal applied to the input terminal 310a of the inverting/noninverting unit 304; FIG. 3(b), a clock signal before division (a clock signal before division applied to the fixed divider 305) output from the inverting/noninverting unit 304; FIG. 3(c), an output clock signal from the fixed divider 305; and FIG. 3(d), the signal level of the control terminal 310b of the inverting/noninverting unit 304. Note that in this timing chart, a time difference produced between the clock signal before division and the output clock signal is omitted.

When an input clock signal rises (when a clock pulse is generated) at a point t1 shown in FIG. 3(a), the inverting/noninverting unit 304 passes the leading edge of this input clock signal without inverting it.

Consequently, a clock signal before division rises (the point t1 shown in FIG. 3(b)), and is applied to the fixed divider 305. Since the pulse width (a pulse width between t1 and t2) of a clock pulse of this clock signal before division is Tck/2 or more, i.e., larger than the pulse width of a small pulse to be described later, the fixed divider 305 validates this clock pulse, receives its leading edge, and raises an output clock signal (the point t1 shown in FIG. 3(c)).

When the input clock signal rises again (when a clock pulse is generated) at a point t3 shown in FIG. 3(a), the inverting/noninverting unit 304 passes the leading edge of the input clock signal without inverting it in the same manner as above. Consequently, the clock signal before division rises (the point t3 shown in FIG. 3(b)), and is applied to the fixed divider 305. Since the pulse width (a pulse width between t3 and t4) of a clock pulse of this clock signal before division is Tck/2 or more, i.e., larger than the pulse width of the small pulse to be described later, the fixed divider 305 validates this clock pulse, receives its leading edge, and lowers the output clock signal (the point t3 shown in FIG. 3(c)).

By repeating the same operation after that, the variable divider 300 generates an output clock signal having one pulse whenever two clock pulses of the input clock signal are applied, and thereby operates as a ½ divider.

[When Feedback Path Is Connected]

When the control signal M is level "1", the connection device 306 turns on the feedback path 307 to connect the output 310c of the fixed divider 305 to the control terminal 310b of the inverting/noninverting unit 304.

Figure 4:
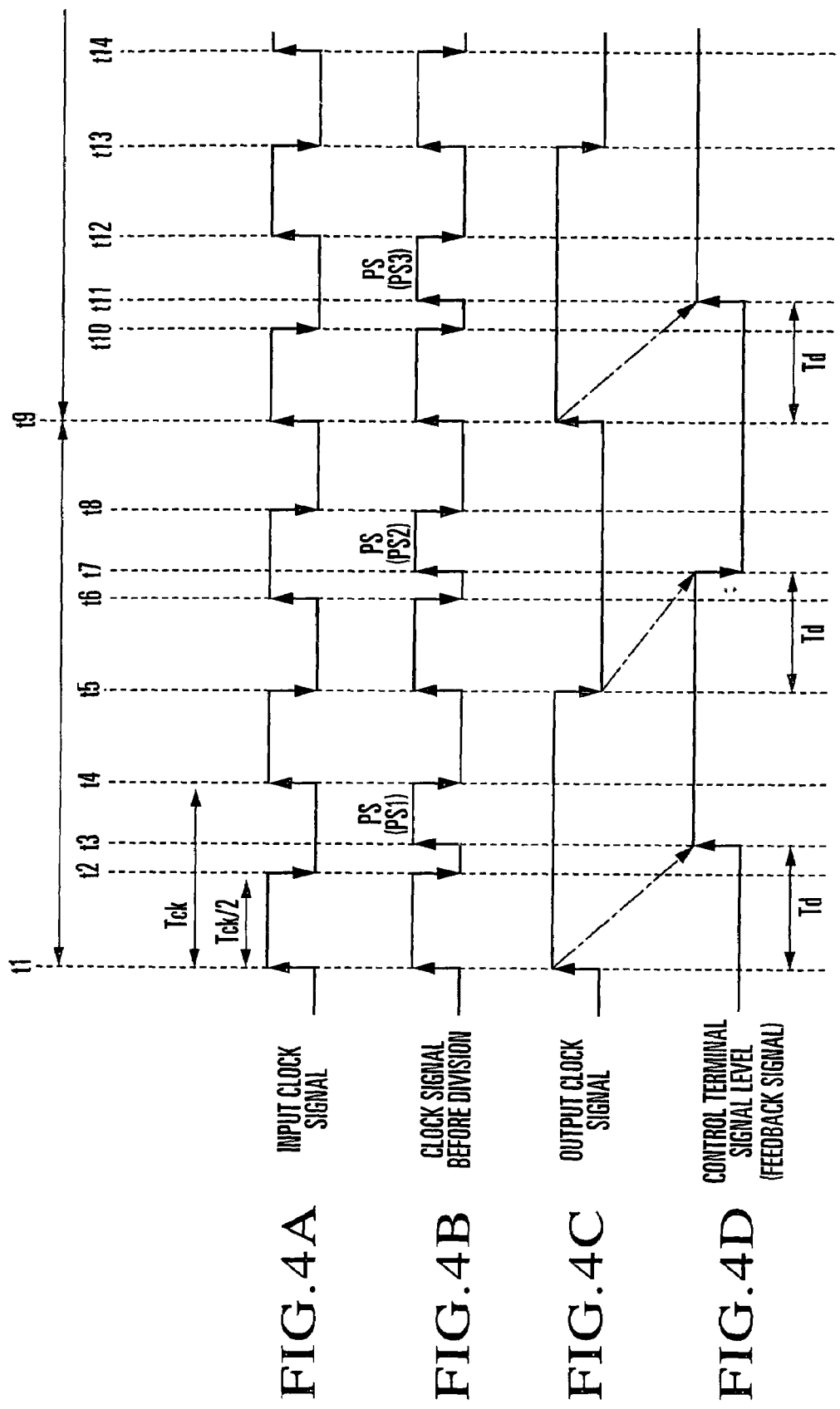
FIG. 4 is a timing chart showing an operation hen the feedback path is connected in embodiment 1.

FIG. 4 shows a timing chart when the feedback path 307 is connected. When an input clock signal rises (a clock pulse is generated) at a point t1 shown in FIG. 4(a), the inverting/noninverting unit 304 passes the leading edge of this input clock signal without inverting it. Consequently, a clock signal before division rises (the point t1 shown in FIG. 4(b)), and is applied to the fixed divider 305. Since the pulse width (a pulse width between t1 and t2) of a clock pulse of this clock signal before division is Tck/2 or more, i.e., larger than the pulse width of the small pulse to be described later, the fixed divider 305 validates this clock pulse, receives its leading edge (a change point corresponding to the leading edge of the input clock signal), and raises an output clock signal (the point t1 shown in FIG. 4(c)).

The leading edge of this output clock signal is returned to the control terminal 310b of the inverting/noninverting unit 304 via the feedback path 307. To the control terminal 310b of the inverting/noninverting unit 304, the leading edge of the output clock signal is returned (a point t3 shown in FIG. 4(d)) as it lags behind the leading edge (the leading edge of the first clock pulse: the point t1 in FIG. 4(a)) of the input clock signal applied to the input terminal 310a of the inverting/noninverting unit 304, by the delay time Td, i.e., by a delay time larger than the pulse width Tck/2 of the input clock signal. FIG. 4 shows an example in which the delay time Td is Tck/2<Td<Tck.

While the signal (feedback signal) returned to the control terminal 310b is high, the inverting/noninverting unit 304 inverts the input clock signal from the input terminal 310a. In this case, when the feedback signal to the control terminal 310b of the inverting/noninverting unit 304 rises (the point t3 shown in FIG. 4(d)), the input clock signal to the input terminal 310a of the inverting/noninverting unit 304 has already fallen. Accordingly, the inverting/noninverting unit 304 inverts the input clock signal from the input terminal 310a, and raises a clock signal before division (the point t3 shown in FIG. 4(b)). After that, the clock signal before division is a signal obtained by inverting the input clock signal from the input terminal 310a.

Consequently, between the point t3 and a point t4 shown in FIG. 4(b), a clock pulse (small pulse) PS1 having a pulse width smaller than the pulse width Tck/2 (a normal pulse width) of the input clock signal is generated. After that, a clock pulse having the normal pulse width is generated between points t5 and t6.

Of the clock signal before division from the inverting/noninverting unit 304, the fixed divider 305 invalidates the small pulse PS1, and validates the clock pulse having the normal pulse width which is generated after that. The fixed divider 305 receives the leading edge of this clock pulse having the normal pulse width, and lowers an output clock signal (the point t5 shown in FIG. 4(c)).

The trailing edge of this output clock signal is returned to the control terminal 310b of the inverting/noninverting unit 304 via the feedback path 307. To the control terminal 310b of the inverting/noninverting unit 304, the trailing edge of the output clock signal is returned (a point t7 shown in FIG. 4(d)) as it lags behind the trailing edge (the trailing edge of the second clock pulse: the point t5 in FIG. 4(a)) of the input clock signal applied to the input terminal 310a of the inverting/noninverting unit 304, by the delay time Td, i.e., by a delay time larger than the pulse width Tck/2 of the input clock signal.

While the signal (feedback signal) returned to the control terminal 310b is low, the inverting/noninverting unit 304 passes the input clock signal from the input terminal 310a without inverting it. In this case, when the feedback signal to the control terminal 310b of the inverting/noninverting unit 304 falls (the point t7 shown in FIG. 4(d)), the input clock signal to the input terminal 310a of the inverting/noninverting unit 304 has already risen. Accordingly, the inverting/noninverting unit 304 passes the input clock signal from the input terminal 310a without inverting it, and raises a clock signal before division (the point t7 shown in FIG. 4(b)). After that, the clock signal before division is a signal obtained by passing the input clock signal from the input terminal 310a without inverting it.

Consequently, a small pulse PS2 is generated between the point t7 and a point t8 shown in FIG. 4(b), and a clock pulse having the normal pulse width is generated between points t9 and t10. Of the clock signal before division from the inverting/noninverting unit 304, the fixed divider 305 invalidates the small pulse PS2, and validates the clock pulse having the normal pulse width which is generated after that. The fixed divider 305 receives the leading edge (a change point corresponding to the leading edge of the input clock signal) of this clock pulse having the normal pulse width, and raises an output clock signal (the point t9 shown in FIG. 4(c)).

By repeating the same operation after that, the variable divider 300 generates an output clock signal having one pulse whenever three clock pulses of the input clock signal are applied, and thereby operates as a ⅓ divider. During this dividing operation, the fixed divider 305 forms an output clock signal (the points t1 and t9 in FIG. 4(b)) by receiving the leading edge of the clock pulse having the normal pulse width, i.e., a change point corresponding to the leading edge of the input clock signal (a change point corresponding to a change point in one direction of the input clock signal). Therefore, no jitter occurs even if the duty ratio of the input clock signal is higher or lower than 50% as an ideal value. This makes it possible to substantially eliminate jitter occurring in the output clock signal, and prevent deterioration of the noise performance. Also, as is apparent from the arrangement shown in FIG. 1, the variable divider 300 has a small number of branch points, and generates no such path having a large capacitive load as a critical path, so low power consumption can be realized.

Note that in FIG. 1, the fixed divider 305 is given a function (to be referred to as a small pulse input invalidating function hereinafter) "which extracts, as a valid clock signal, only a clock pulse larger than the pulse width of the small pulse PS from the clock signal before division from the inverting/noninverting unit 304". However, it is also possible to give the inverting/noninverting unit 304 a function "which outputs, as the clock signal before division, only a clock pulse larger than the pulse width of the small pulse PS". That is, the inverting/noninverting unit 304 may also be given a function (to be referred to as a small pulse output prohibiting function hereinafter) "which does not output, as the clock signal before division, a clock pulse equal to or smaller than the pulse width of the small pulse PS". In this case, the fixed divider 305 may or may not be given the small pulse input invalidating function.

The small pulse output prohibiting function of the inverting/noninverting unit 304 or the small pulse input invalidating function of the fixed divider 305 may also be realized by using the speed response characteristics of the inverting/noninverting unit 304 or fixed divider 305. That is, if the minimum operating pulse width of the inverting/noninverting unit 304 or fixed divider 305 is designed to be larger than the pulse width of the small pulse PS, the small pulse output prohibiting function or small pulse input invalidating function can be obtained by preventing the inverting/noninverting unit 304 or fixed divider 305 from operating in response to the small pulse PS smaller than this minimum operating pulse width.

In this case, the smaller the pulse width of the small pulse PS, the wider the operation margin, so it is also possible to make the width of the small pulse PS as small as possible by adjusting the delay time Td. In this embodiment, the operation margin is a maximum when the delay time Td is an integral multiple of the pulse width Tck/2 of the input clock signal.

Figure 5:
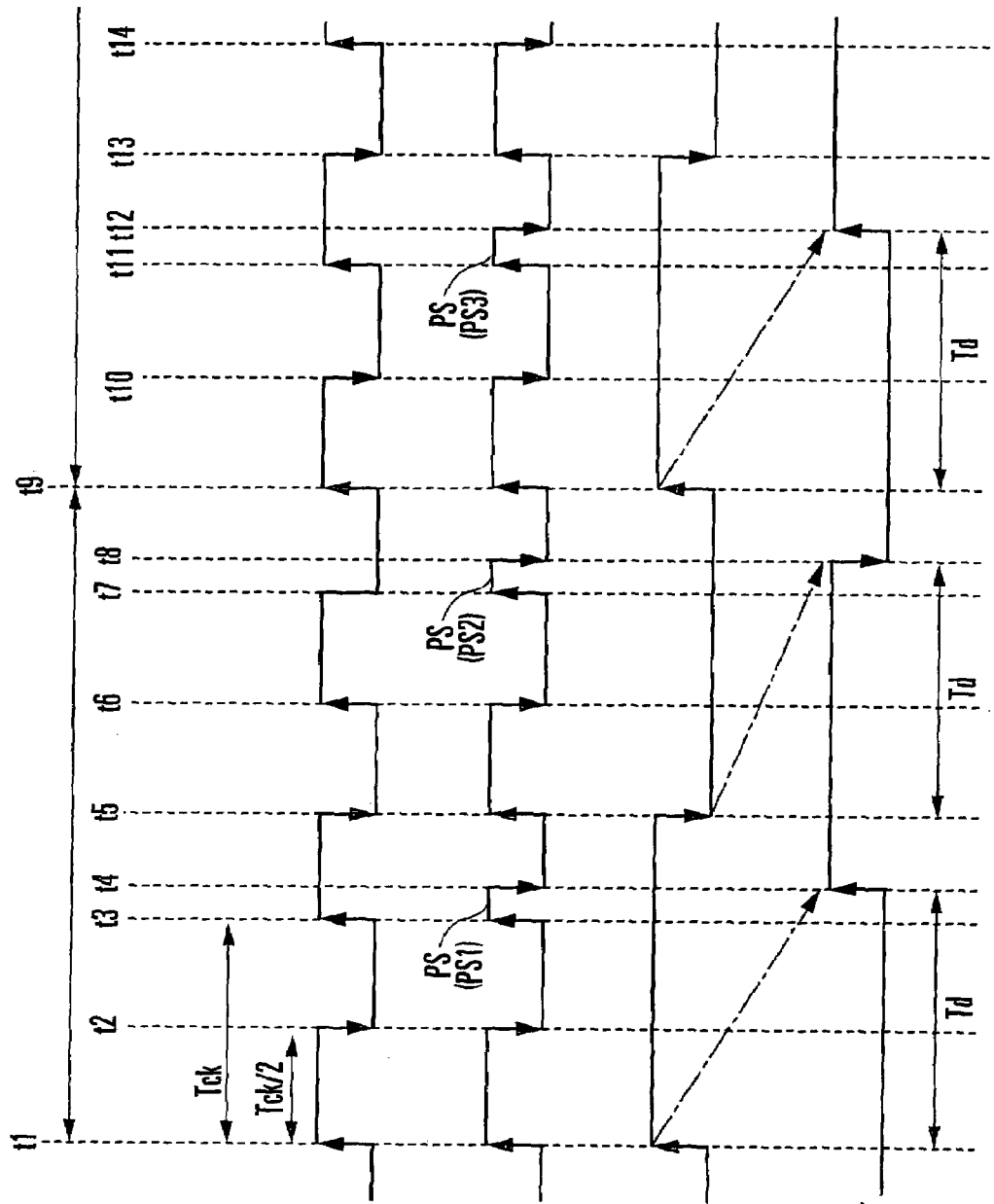
FIG. 5 is a timing chart showing an operation hen a delay time is made slightly larger than the period of an input clock signal in embodiment 1.

Also, FIG. 4 shows an example in which the delay time Td is slightly larger than the pulse width Tck/2 of the input clock signal, but the same operation can be realized regardless of the value of the delay time Td as long as it is larger than the pulse width Tck/2 of the input clock pulse. FIG. 5 shows a timing chart when the delay time Td is slightly larger than the period Tck of the input clock signal. The variable divider 300 operates as a ½ divider when the control signal M is level "0" (when the feedback path 307 is disconnected), and operates as a ⅓ divider when the control signal M is level "1" (when the feedback path 307 is connected), in this example shown in FIG. 5 as well.

Note that the frequency division number of the fixed divider 305 is 2 in the variable divider 300 shown in FIG. 1, but the frequency division number is, of course, not limited to 2. When a ⅓ divider or ⅕ divider is used as the fixed divider 305, ⅓ or ¼ division or ⅕ or ⅙ division can be realized. When a 1/N circuit is used as the fixed divider 305, a 1/N or 1/(N+1) divider can be realized.

Embodiment 2

Figures 6, 7:
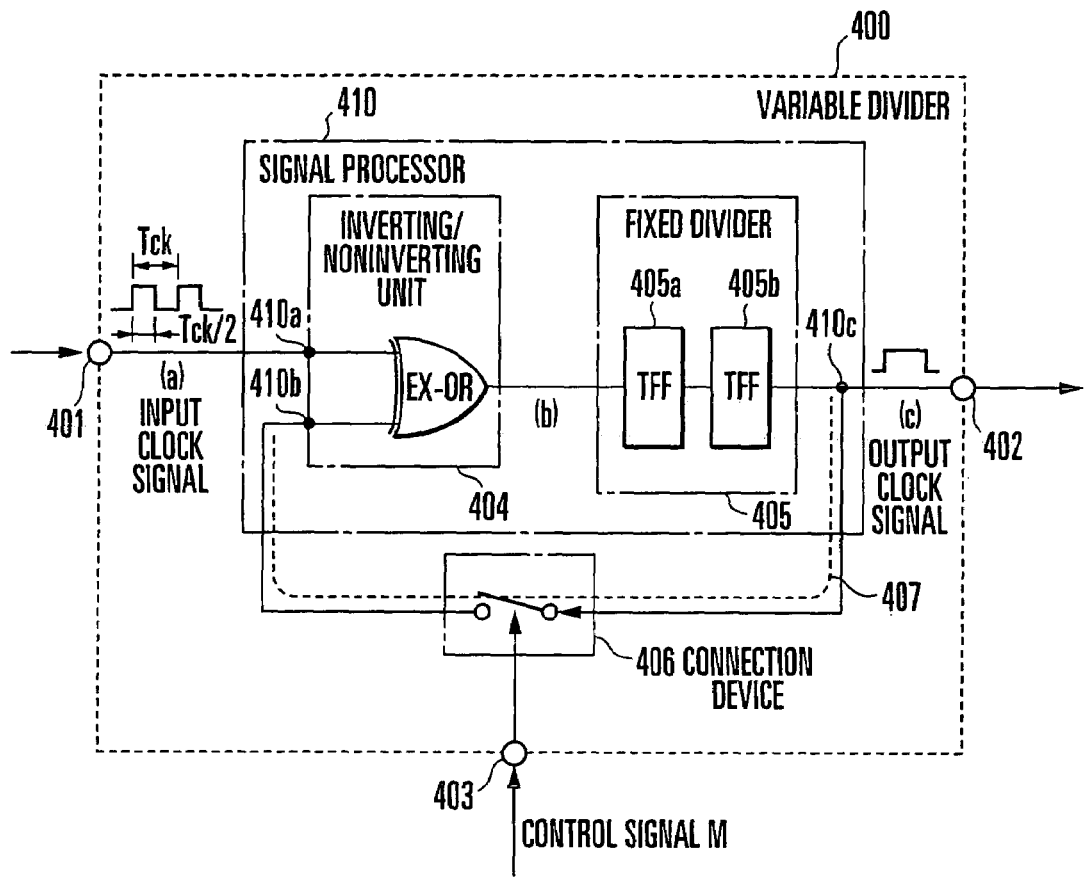
FIG. 6 is a schematic view of a variable divider showing the second embodiment (embodiment 2) of the present invention.
FIG. 7 is a view showing a truth table of an inverting/noninverting unit (exclusive-OR circuit) in embodiment 2.

FIG. 6 is a schematic view of a variable divider showing the second embodiment (embodiment 2) of the present invention. A variable divider 400 uses an exclusive-OR circuit (EX-OR) as an inverting/noninverting unit 404, and uses a ¼ divider having two series-connected TFFs (405a and 405b) as a fixed divider 405.

In the inverting/noninverting unit 404, a terminal 410a connecting to one input of the EX-OR is an input terminal (the input terminal of a signal processor 410), and a terminal 410b connecting to the other input is a control terminal (the control terminal of the signal processor 410). The input terminal 410a is connected to a clock input terminal 401, and a feedback path 407 is formed between the control terminal 410b and an output (the output terminal of the signal processor 410) 410c of the fixed divider 405. A connection device 406 is inserted into the feedback path 407. FIG. 7 shows a truth table of the inverting/noninverting unit (exclusive-OR circuit) 404.

[When Feedback Path Is Disconnected]

When a control signal M is level "0", the connection device 406 turns off the feedback path 407 to disconnect the output 410c of the fixed divider 405 from the control terminal 410b of the inverting/noninverting unit 404. In this case, the level of the control terminal 410b of the inverting/noninverting unit 404 changes to level "0", so the inverting/noninverting unit 404 passes an input clock signal without inverting it, by an exclusive-OR operation based on the truth table shown in FIG. 7, and applies the signal as a clock signal before division to the fixed divider 405.

Figure 8:
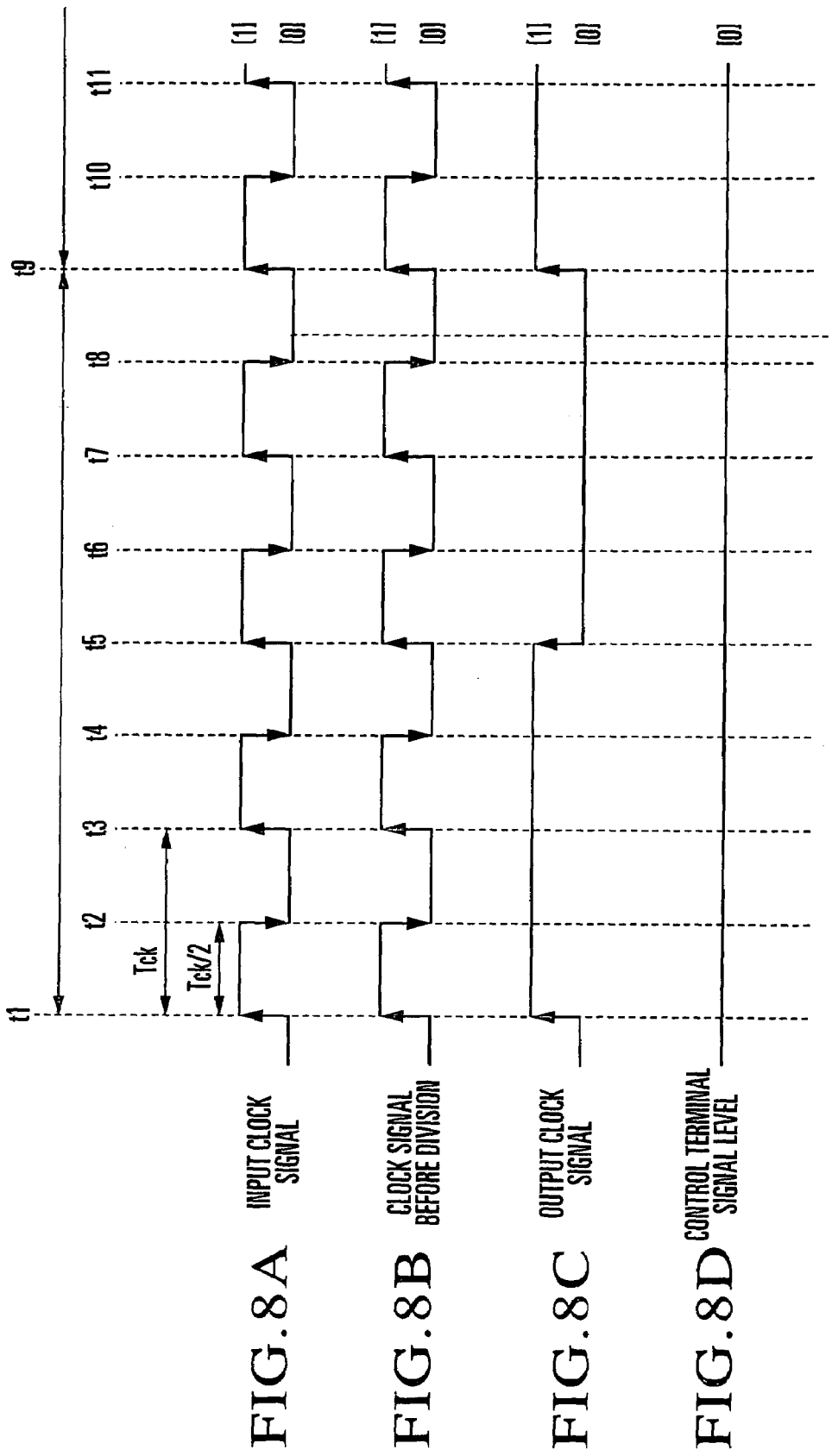
FIG. 8 is a timing chart showing an operation when a feedback path is disconnected in embodiment 2.

FIG. 8 shows a timing chart when the feedback path 407 is disconnected. FIG. 8(a) indicates an input clock signal applied to the input terminal 410a of the inverting/noninverting unit 404; FIG. 8(b), a clock signal before division output from the inverting/noninverting unit 404 (a clock signal before division applied to the fixed divider 405); FIG. 8(c), an output clock signal from the fixed divider 405; and FIG. 8(d), the signal level of the control terminal 410b of the inverting/noninverting unit 404. Not that in this timing chart, a time difference produced between the clock signal before division and the output clock signal is omitted.

As can be seen from this timing chart, when the control signal M is level "0", the variable divider 400 generates an output clock signal having one pulse whenever four clock pulses of the input clock signal are applied, and thereby operates as a ¼ divider.

[When Feedback Path Is Disconnected]

When the control signal M is level "1", the connection device 406 turns on the feedback path 407 to connect the output 410c of the fixed divider 405 to the control terminal 410b of the inverting/noninverting unit 404.

Figure 9:
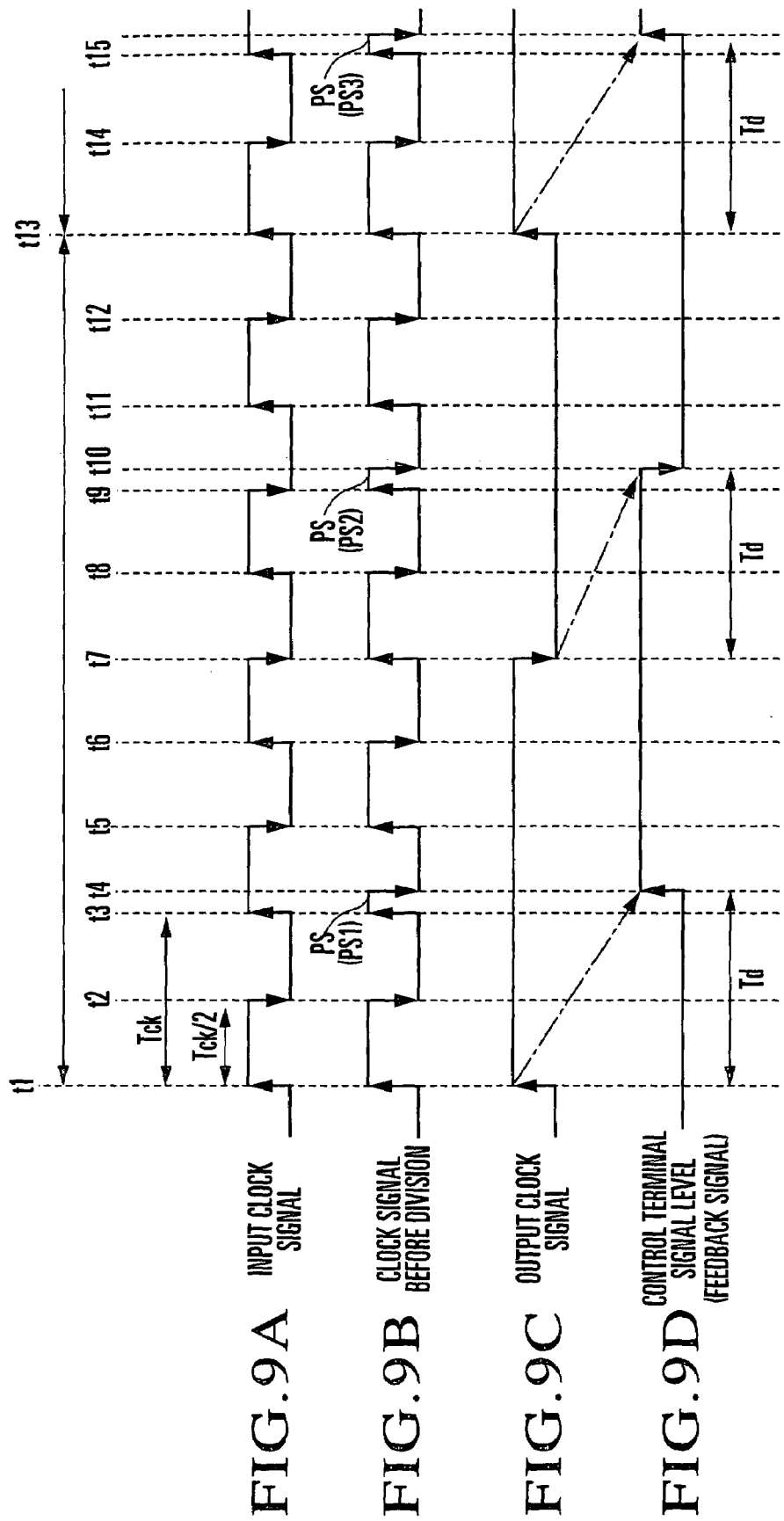
FIG. 9 is a timing chart showing an operation when the feedback path is connected in embodiment 2.

FIG. 9 shows a timing chart when the feedback path 407 is connected. Note that in this timing chart, a delay time Td during which a signal applied to the input terminal 410a of the inverting/noninverting unit 404 is returned to the control terminal 410b of the inverting/noninverting unit 404 via the inverting/noninverting unit 404, fixed divider 405, and feedback path 407 is slightly larger than a period Tck of an input clock signal ((3/2)·Tck>Td>Tck). Note also that the fixed divider 405 has a small pulse input invalidating function.

As is apparent from this timing chart, when the control signal M is level "1", the variable divider 400 generates an output clock signal having one pulse whenever five clock pulses of an input clock signal are applied, and thereby operates as a ⅕ divider. During this dividing operation, the fixed divider 405 forms an output clock signal (points t1 and t13 in FIG. 9(b)) by receiving the leading edge of a clock signal having a normal pulse width, i.e., a change point corresponding to the leading edge of the input clock signal (a change point corresponding to a change point in one direction of the input clock signal). Therefore, no jitter occurs even if the duty ratio of the input clock signal is higher or lower than 50% as an ideal value. This makes it possible to substantially eliminate jitter occurring in the output clock signal, and prevent deterioration of the noise performance. Also, as is apparent from the arrangement shown in FIG. 6, the variable divider 400 has a small number of branch points, and generates no such path having a large capacitive load as a critical path, so low power consumption can be realized.

Note that the fixed divide 405 in which two TFFs are connected in series is used in this embodiment, but it is also possible to realize a variable divider capable of switching its frequency division numbers, e.g., ⅛ or ⅑, 1/16 or 1/17, 1/32 or 1/33, and 1/64 or 1/65, by increasing the number of the series-connected TFFs to "3", "4", "5", and "6", respectively.

Note also that the fixed divider 405 is given the small pulse input invalidating function in this embodiment, but the inverting/noninverting unit 404 may also be given a small pulse output prohibiting function.

Embodiment 3

Figure 10:
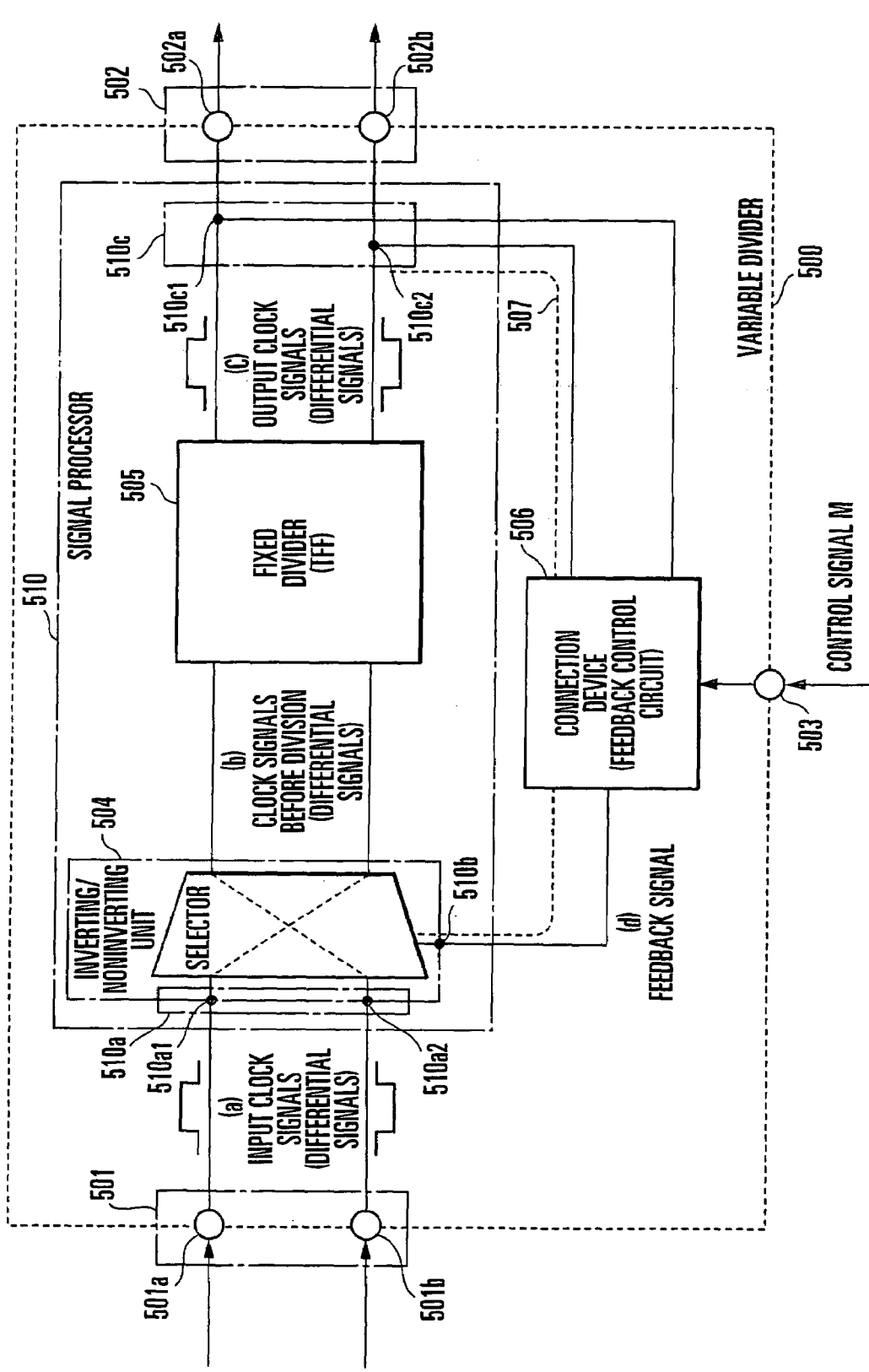
FIG. 10 is a schematic view of a variable divider showing the third embodiment (embodiment 3) of the present invention.

FIG. 10 is a schematic view of a variable divider showing the third embodiment (embodiment 3) of the present invention. A variable divider 500 uses a selector as an inverting/noninverting unit 504, a differential circuit having (one) TFF as a fixed divider 505, and a feedback control circuit as a connection device 506.

In the variable divider 500, a clock input terminal 501 is made up of a first clock input terminal 501a and second clock input terminal 501b, one differential signal applied as an input clock signal is applied to the first clock input terminal 501a, and the other differential signal is applied to the second clock input terminal 501b. Also, an input terminal (the input terminal of a signal processor 510) 510a of the inverting/noninverting unit 504 is made up of a first input terminal 510a1 and second input terminal 510a2, one differential signal from the first clock input terminal 501a is applied to the first input terminal 510a1, and the other differential signal from the second clock input terminal 501b is applied to the second input terminal 510a2.

The inverting/noninverting unit (selector) 504 inverts/does not invert clock input signals (differential signals) applied to the input terminal 510a in accordance with the level of a signal applied to a control terminal (the control terminal of the signal processor 510) 510b, and outputs the signals as clock signals before division (differential signals). In this embodiment, when the signal applied to the control terminal 510b is level "1", the inverting/noninverting unit 504 switches input/output paths as indicated by the broken lines in FIG. 10, thereby alternately inverting the differential signals. When the signal applied to the control terminal 510b changes to level "0", the inverting/noninverting unit 504 restores the original paths.

The connection device (feedback control circuit) 506 is inserted into a feedback path 507 formed between an output (the output terminal of the signal processor 510) 510c (510c1 and 510c2) of the fixed divider 505 and the control terminal 510b of the inverting/noninverting unit 504, and generates a feedback signal corresponding to the output results of the output clock signals (differential signals) from the fixed divider 505. In this embodiment, the connection device 506 generates a feedback signal of level "1" when the level difference between the differential signals is large, and a signal of level "0" when the level difference between the differential signals is small.

Also, the connection device (feedback control circuit) 506 turns off the feedback path 507 when the control signal M from the control signal input terminal 503 is level "0", and turns on the feedback path 507 when the control signal M is level "1". When the feedback path 507 is ON, the connection device (feedback control circuit) 506 applies, to the control terminal 510b of the inverting/noninverting unit 504, a feedback signal corresponding to the output results of the output clock signals (differential signals) from the fixed divider 505. When the feedback path 507 is OFF, the level of the control terminal 510b of the inverting/noninverting unit 504 changes to level "0"

[When Feedback Path Is Disconnected]

When the control signal M is level "0", the connection device (feedback control circuit) 506 turns off the feedback path 507 to disconnect the output 510c of the fixed divider 505 from the control terminal 510b of the inverting/noninverting unit 504. In this case, the level of the control terminal 510b of the inverting/noninverting unit 504 changes to level "0", so the inverting/noninverting unit 504 passes the input clock signals (differential signals) without inverting them, and applies the signals as clock signals before division to the fixed divider 505. This fixed divider 505 divides the clock signals before division to obtain output clock signals (differential signals). In this manner, the variable divider 500 operates as a ½ divider.

[When Feedback Path Is Connected]

When the control signal M is level "1", the connection device (feedback control circuit) 506 turns on the feedback path 507 to connect the output 510c of the fixed divider 505 to the control terminal 510b of the inverting/noninverting unit 504.

Figure 11:
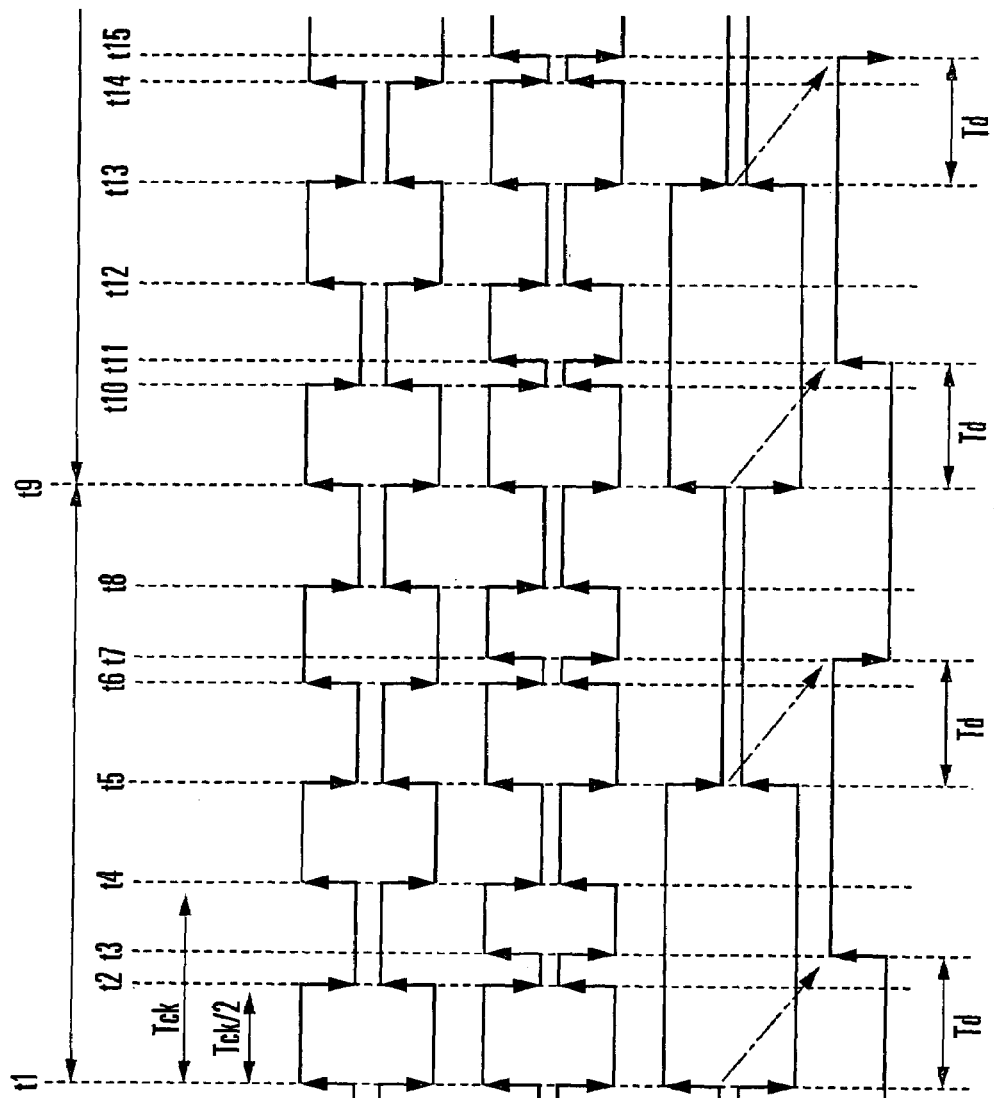
FIG. 11 is a timing chart showing an operation when a feedback path is connected in embodiment 3.

FIG. 11 shows a timing chart when the feedback path 507 is connected. FIG. 11(a) indicates input clock signals (differential signals) applied to the input terminal 510a of the inverting/noninverting unit 504; FIG. 11(b), clock signals before division (differential signals) output from the inverting/noninverting unit 504; FIG. 11(c), output clock signals (differential signals) from the fixed divider 505; and FIG. 11(d), a feedback signal applied to the control terminal 510b of the inverting/noninverting unit 504 via the feedback path 507.

Note that in this timing chart, a time difference produced between the clock signals before division and the output clock signals is omitted. Also, a delay time Td during which a signal applied to the input terminal 510a of the inverting/noninverting unit 504 is applied to the control terminal 510b of the inverting/noninverting unit 504 via the inverting/noninverting unit 504, fixed divider 505, and feedback path 507 is made larger than a pulse width Tck/2 of the input clock signals. Furthermore, the fixed divider 505 has a small pulse input invalidating function.

As can be seen from this timing chart, when the control signal M is level "1", the variable divider 500 operates as a ⅓ divider. During this dividing operation, the fixed divider 505 forms an output clock signal (points t1 and t9 in FIG. 11(b)) by receiving the leading edge of a clock pulse having a normal pulse width, i.e., a change point corresponding to the leading edge of the input clock signal (a change point corresponding to a change point in one direction of the input clock signal). Therefore, no jitter occurs even if the duty ratio of the input clock signal is higher or lower than 50% as an ideal value. This makes it possible to substantially eliminate jitter occurring in the output clock signal, and prevent deterioration of the noise performance. Also, as is apparent from the arrangement shown in FIG. 10, the variable divider 500 has a small number of branch points, and generates no such path having a large capacitive load as a critical path, so low power consumption can be realized.

Embodiment 4

Figure 12:
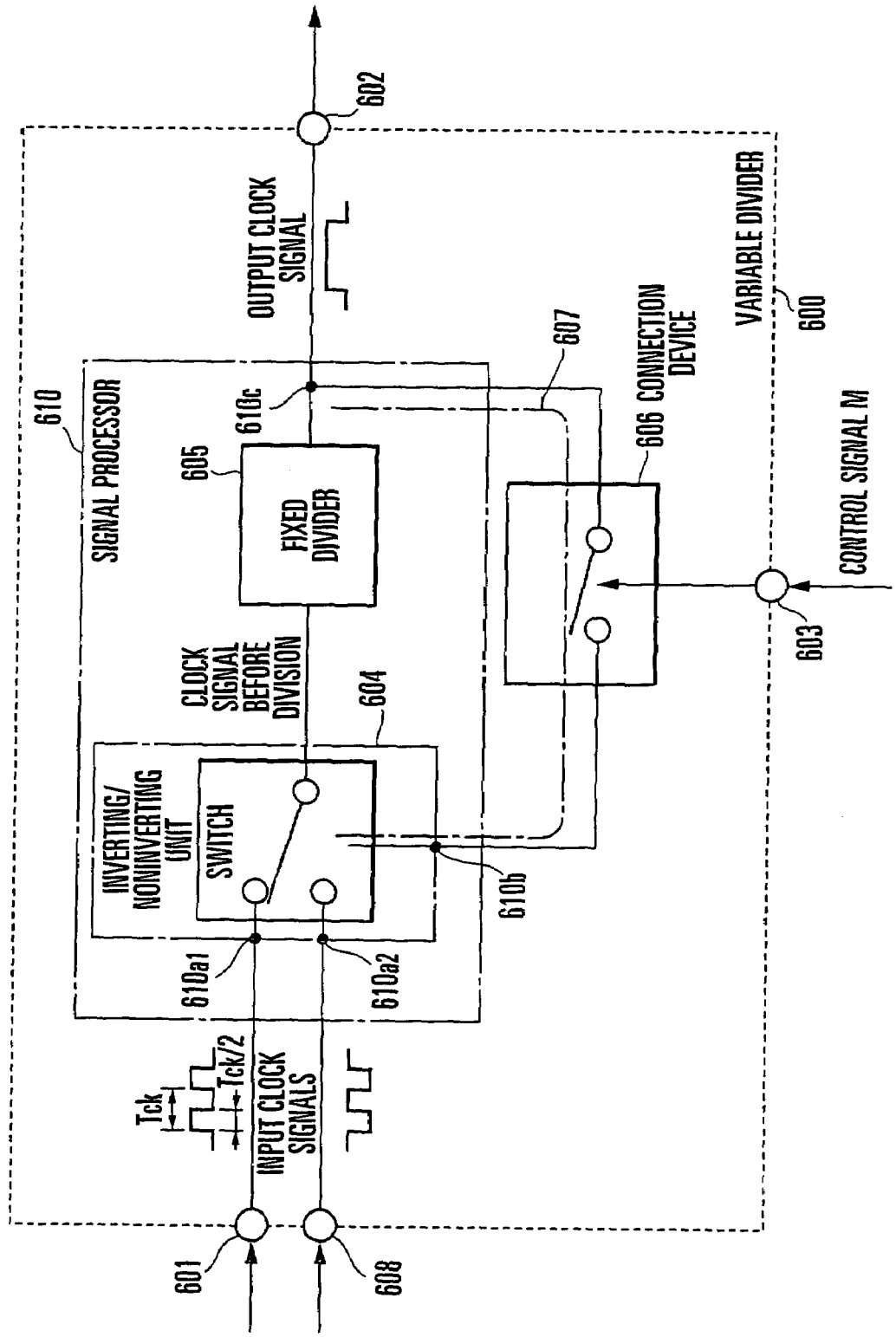
FIG. 12 is a schematic view of a variable divider showing the fourth embodiment (embodiment 4) of the present invention.
Figure 13:
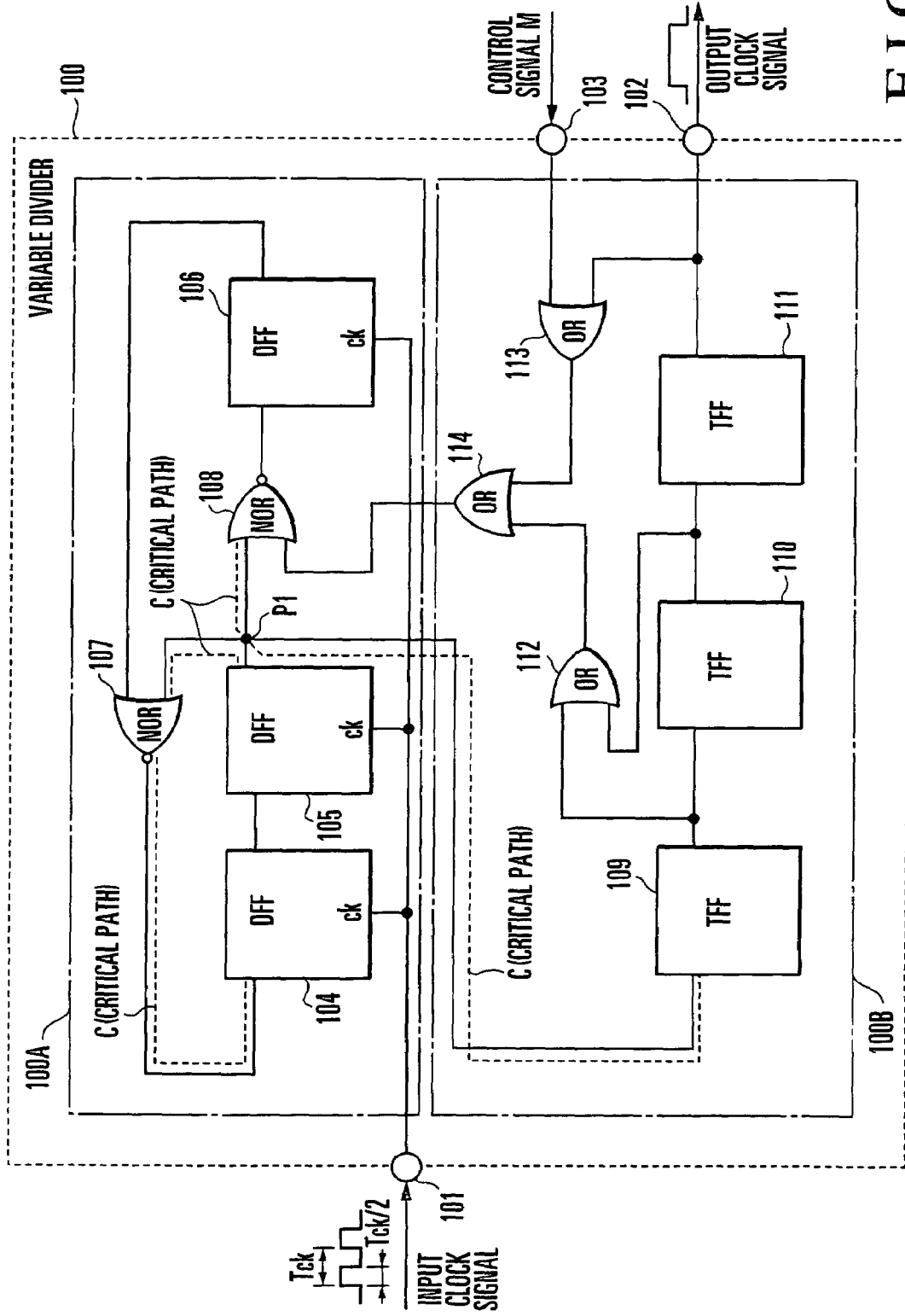
FIG. 13 is a view showing an outline of a conventional variable divider (prior art 1) disclosed in non-patent reference 1.
Figures 14, 15:
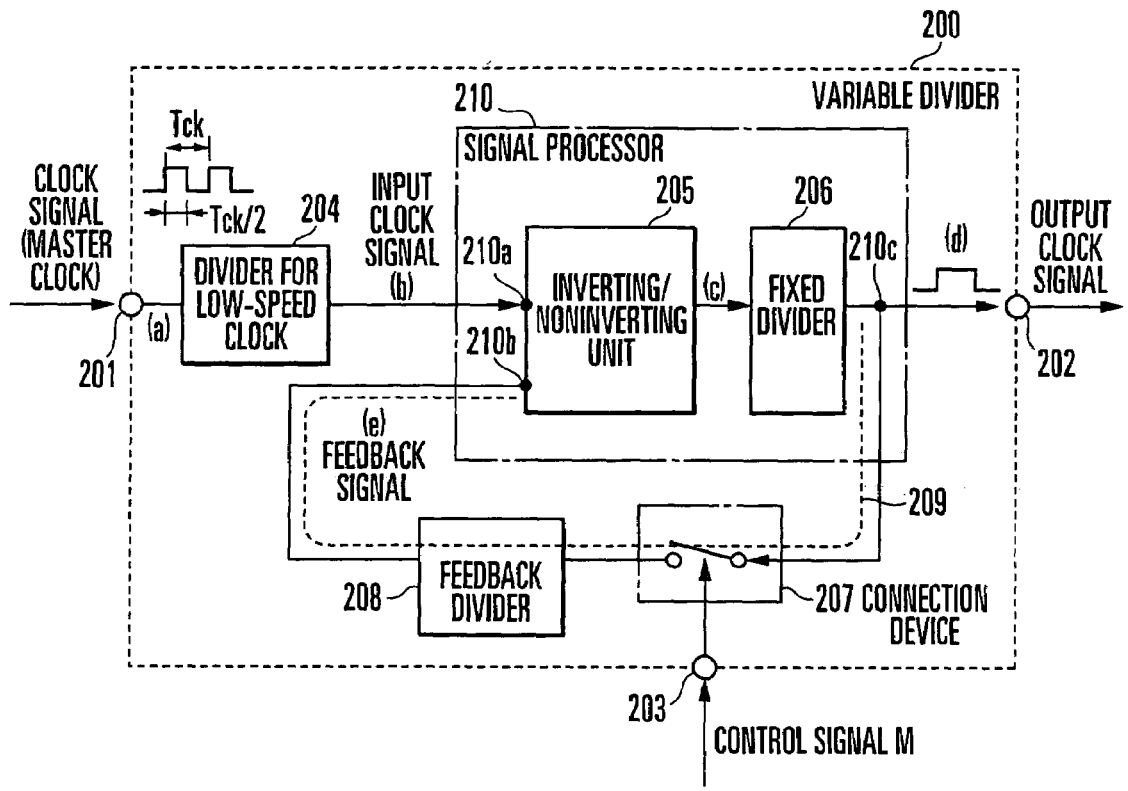
FIG. 14 is a view showing an outline of a conventional variable divider (prior art 2) disclosed in patent reference 1.
FIG. 15 is a view showing a truth table of an inverting/noninverting unit in prior art 2.

FIG. 12 is a schematic view of a variable divider showing the fourth embodiment (embodiment 4) of the present invention. A variable divider 600 uses a single-phase switch as an inverting/noninverting unit 604, a single-phase circuit having (one) TFT as a fixed divider 605, and a single-phase switch as a connection device 606.

The variable divider 600 includes a inverted clock input terminal 608 to which a signal (inverted input clock signal) having a phase opposite to that of an input clock signal is input, in addition to a clock input terminal 601, clock output terminal 602, and control signal input terminal 603. An input clock signal from the clock input terminal 601 is applied to a first input terminal (the first input terminal of a signal processor 610) 610a1 of the inverting/noninverting unit 604, and a inverted input clock signal from the inverted clock input terminal 608 is applied to a second input terminal (the second input terminal of the signal processor 610) 610a2 of the inverting/noninverting unit 604.

When a signal applied to a control terminal (the control terminal of the signal processor 610) 610b is level "0", the inverting/noninverting unit 604 closes the switch path to the first input terminal 610a1, and outputs the input clock signal from the first input terminal 610a1 as a clock signal before division. When the signal applied to the control terminal 610b is level "1", the inverting/noninverting unit 604 closes the switch path to the second input terminal 610a2, and outputs the inverted input clock signal from the second input terminal 610a2 as a clock signal before division.

That is, in embodiment 4, the inverting/noninverting unit 604 substantially inverts/does not invert the clock input signal from the input terminal 610a1 in accordance with the level of the signal applied to the control terminal 610b, and outputs the signal as a clock signal before division to the fixed divider 605. In this manner, the same operation as the variable divider 300 shown in FIG. 1 can be obtained, and the frequency division number can be switched to a ½ or ⅓ divider in accordance with the level of a control signal M.

Note that in the third and fourth embodiments, it is, of course, possible to realize a variable divider having any frequency division number by changing the frequency division number of the fixed divider. It is also possible to give the inverting/noninverting unit a small pulse output prohibiting function, instead of giving the fixed divider a small pulse input invalidating function.

In a variable divider of this type, the power consumption is presumably almost determined by the number of circuits which operate by a master clock (a signal having the highest frequency). Therefore, when embodiment 1 and prior art 2 (patent reference 1) are compared, the power consumption of prior art 2 is probably slightly smaller. In the techniques of both embodiment 1 and prior art 2, however, blocks which consume electricity most are dividers which initially divide the master clock by 2, so the power consumptions in these portions are the same because the speeds are the same. Accordingly, even if a difference is produced, only a small difference is produced between the "inverting/noninverting units". Note that substantially the same power consumption as in the technique of prior art 2 can be probably obtained by simply forming the inverting/noninverting unit 504 by a selector as the variable divider 500 shown in FIG. 10 and using a block such as a path gate which consumes no power.

INDUSTRIAL APPLICABILITY

A variable divider of the present invention can switch frequency division numbers in accordance with the level of an external control signal. This variable divider can be combined with a high-frequency oscillation circuit or program counter circuit, and is suited to implementing a frequency synthesizer.

The invention claimed is:

1. A variable division method characterized by comprising:
   the signal processing step of forming a clock signal before division by inverting/without inverting an input clock signal applied to an input terminal in accordance with a level of a signal applied to a control terminal, dividing the clock signal before division by a predetermined frequency division number on the basis of a change point, which corresponds to a change point in one direction of the input clock signal, in a clock pulse having a pulse width larger than a predetermined pulse width in the clock signal before division, and outputting the frequency-divided signal as an output clock signal from an output terminal;
   the step of connecting/disconnecting, in accordance with an external control signal, a feedback path which is formed between the output terminal and control terminal and functions as a path of a signal to be returned to the control terminal; and
   the delay step of making a delay time during which a signal applied to the input terminal is returned to the control terminal through the feedback path larger than a pulse width of the input clock signal.

2. A variable division method according to claim 1, characterized in that the signal processing step comprises the steps of:
   outputting the input clock signal applied to the input terminal as a clock signal before division by inverting/without inverting the input clock signal in accordance with the level of the signal applied to the control terminal; and
   extracting, as a valid clock signal, only a clock pulse larger than a predetermined pulse width of the clock signal before division, and outputting the valid clock signal as the output clock signal by dividing the valid clock signal by a predetermined frequency division number on the basis of a change point, which corresponds to a change point in one direction of the input clock signal, of a clock pulse in the valid clock signal.

3. A variable division method according to claim 1, characterized in that the signal processing step comprises the steps of:
   outputting only a clock pulse larger than a predetermined pulse width as a clock signal before division by inverting/without inverting the input clock signal applied to the input terminal in accordance with the level of the signal applied to the control terminal; and
   outputting the clock signal before division as the output clock signal by dividing the clock signal before division by a predetermined frequency division number on the basis of a change point, which corresponds to a change point in one direction of the input clock signal, of a clock pulse in the clock signal before division.

4. A variable division method according to claim 1, characterized in that the delay step ensures the delay time when the signal passes through the feedback path.

5. A variable divider characterized by comprising:
   a signal processor which comprises an input terminal, control terminal, and output terminal, forms a clock signal before division by inverting/without inverting an input clock signal applied to the input terminal in accordance with a level of a signal applied to the control terminal, divides the clock signal before division by a predetermined frequency division number on the basis of a change point, which corresponds to a change point in one direction of the input clock signal, in a clock pulse having a pulse width larger than a predetermined pulse width in the clock signal before division, and outputs the frequency-divided signal as an output clock signal from the output terminal; and
   a connection device which connects/disconnects, in accordance with an external control signal, a feedback path which is formed between the output terminal and control terminal of said signal processor and functions as a path of a signal to be returned to the control terminal,
   wherein a delay time during which a signal applied to the input terminal of said signal processor is returned to the control terminal through the feedback path is made larger than a pulse width of the input clock signal.

6. A variable divider according to claim 5, characterized in that said signal processor comprises:
   an inverting/noninverting unit which outputs the input clock signal applied to the input terminal as a clock signal before division by inverting/without inverting the input clock signal in accordance with the level of the signal applied to the control terminal; and
   a fixed divider which extracts, as a valid clock signal, only a clock pulse larger than a predetermined pulse width of the clock signal before division, and outputs the valid clock signal as the output clock signal by dividing the valid clock signal by a predetermined frequency division number on the basis of a change point, which corresponds to a change point in one direction of the input clock signal, of a clock pulse in the valid clock signal.

7. A variable divider according to claim 5, characterized in that said signal processor comprises:
   an inverting/noninverting unit which outputs only a clock pulse larger than a predetermined pulse width as a clock signal before division by inverting/without inverting the input clock signal applied to the input terminal in accordance with the level of the signal applied to the control terminal; and
   a fixed divider which outputs the clock signal before division from said inverting/noninverting unit as the output clock signal by dividing the clock signal before division by a predetermined frequency division number on the basis of a change point, which corresponds to a change point in one direction of the input clock signal, of a clock pulse in the clock signal before division.

8. A variable divider according to claim 5, characterized in that delay means for making the delay time larger than a pulse width of the input clock signal is formed in the feedback path.

* * * * *

UNITED STATES PATENT AND TRADEMARK OFFICE
CERTIFICATE OF CORRECTION

| | | |
|---|---|---|
| PATENT NO. | : 7,180,341 B2 | Page 1 of 1 |
| APPLICATION NO. | : 10/545718 | |
| DATED | : February 20, 2007 | |
| INVENTOR(S) | : Harada et al. | |

It is certified that error appears in the above-identified patent and that said Letters Patent is hereby corrected as shown below:

In the Brief Description of the Drawings, Fig. 3, Col. 7, line 33, please delete "hen" and insert -- when --.

In the Brief Description of the Drawings, Fig. 4, Col. 7, line 35, please delete "hen" and insert -- when --.

In the Brief Description of the Drawings, Fig. 5, Col. 7, line 37, please delete "hen" and insert -- when --.

In the Brief Description of the Drawings, Fig. 16, Col. 7, line 64, please delete "hen" and insert -- when --.

Signed and Sealed this

Seventh Day of August, 2007

JON W. DUDAS
*Director of the United States Patent and Trademark Office*